(12) United States Patent
Tanaka

(10) Patent No.: US 8,179,592 B2
(45) Date of Patent: May 15, 2012

(54) SEMICONDUCTOR OPTICAL AMPLIFIER, METHOD FOR MANUFACTURING THE SAME, AND SEMICONDUCTOR OPTICAL INTEGRATED DEVICE

(75) Inventor: Shinsuke Tanaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 496 days.

(21) Appl. No.: 12/403,732

(22) Filed: Mar. 13, 2009

(65) Prior Publication Data

US 2009/0237780 A1 Sep. 24, 2009

(30) Foreign Application Priority Data

Mar. 18, 2008 (JP) ................................. 2008-069735

(51) Int. Cl.
*H04B 10/17* (2006.01)
(52) U.S. Cl. ........................................................ 359/344
(58) Field of Classification Search .................. 359/334
See application file for complete search history.

(56) References Cited

U.S. PATENT DOCUMENTS

| | | | | |
|---|---|---|---|---|
| 5,388,117 A * | 2/1995 | Nishimura | .................. | 372/50.22 |
| 5,659,565 A * | 8/1997 | Kitamura | .................... | 372/43.01 |
| 5,859,866 A * | 1/1999 | Forrest et al. | ............ | 372/50.124 |
| 5,929,462 A | 7/1999 | Kasukawa et al. | | |
| 6,487,007 B1 * | 11/2002 | Morito | ........................... | 359/344 |
| 7,542,201 B2 * | 6/2009 | Tanaka et al. | .................. | 359/344 |
| 7,859,745 B2 * | 12/2010 | Tanaka et al. | .................. | 359/344 |
| 2004/0196540 A1 * | 10/2004 | Lealman et al. | ............... | 359/344 |
| 2005/0092979 A1 | 5/2005 | Han et al. | | |

FOREIGN PATENT DOCUMENTS

| | | |
|---|---|---|
| EP | 0612129 B1 | 8/1994 |
| JP | 04-027183 A | 1/1992 |
| JP | 6-244508 A | 9/1994 |
| JP | 2001-177193 A | 6/2001 |
| JP | 2002-016322 A | 1/2002 |
| JP | 2004266095 A * | 9/2004 |

OTHER PUBLICATIONS

United Kingdom Search report dated Jun. 19, 2009, issued in corresponding United Kingdom Patent application No. GB0904551.9.

\* cited by examiner

*Primary Examiner* — Eric Bolda
(74) *Attorney, Agent, or Firm* — Westerman, Hattori, Daniels & Adrian, LLP

(57) ABSTRACT

A semiconductor optical amplifier is provided having polarization independent optical amplification characteristics and a flat gain spectrum over a wide wavelength region. In the semiconductor optical amplifier including a multi-quantum well active layer formed of well layers and barrier layers alternately laminated to each other on an InP substrate, the well layers and the barrier layers each have a tensile strain, and the tensile strain of each of the barrier layers is larger than the tensile strain of each of the well layers.

17 Claims, 15 Drawing Sheets

FIG. 5
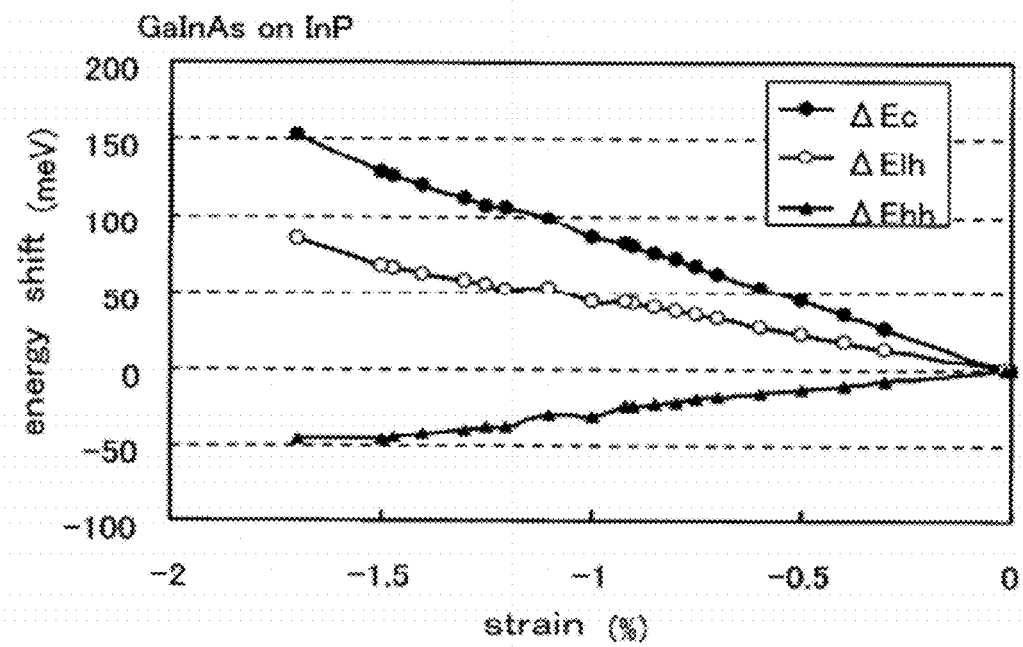
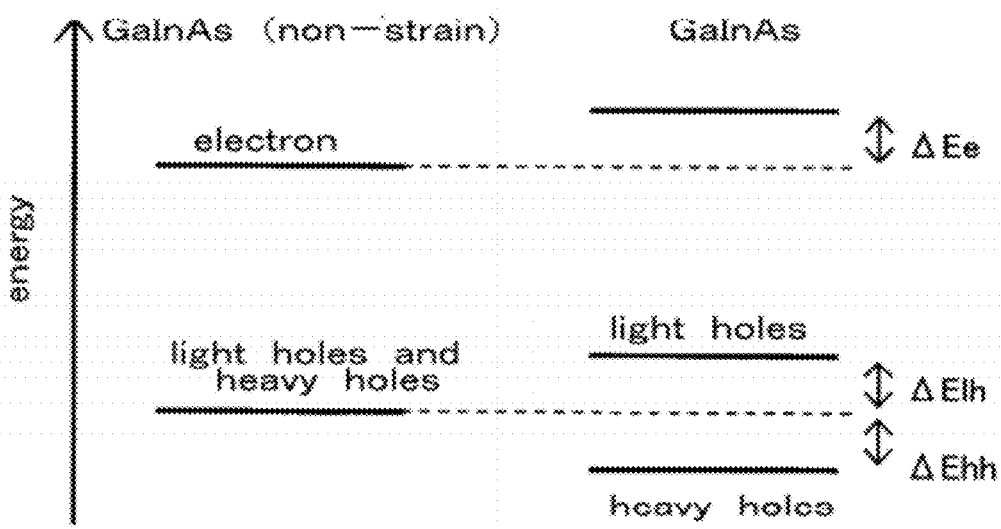

FIG.12
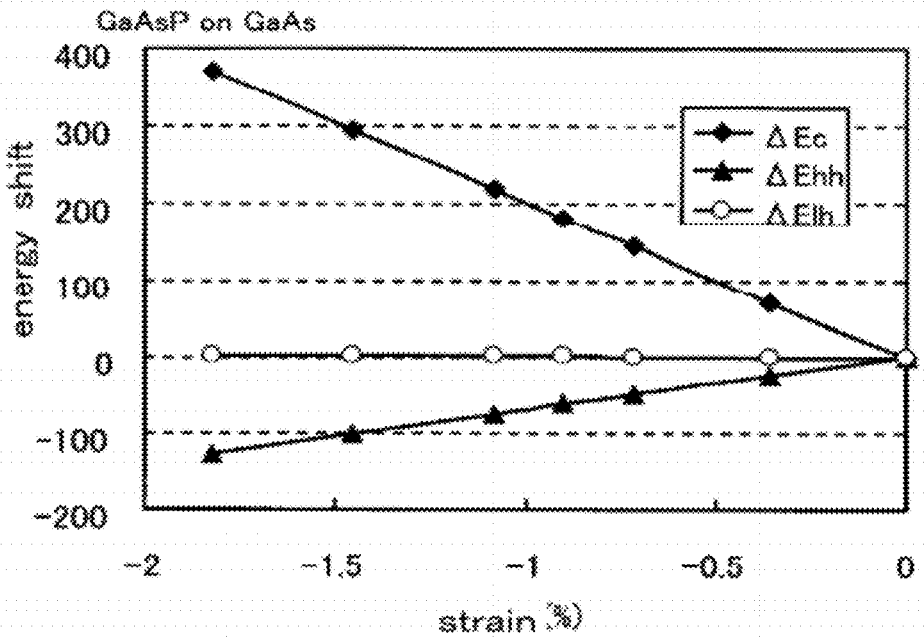
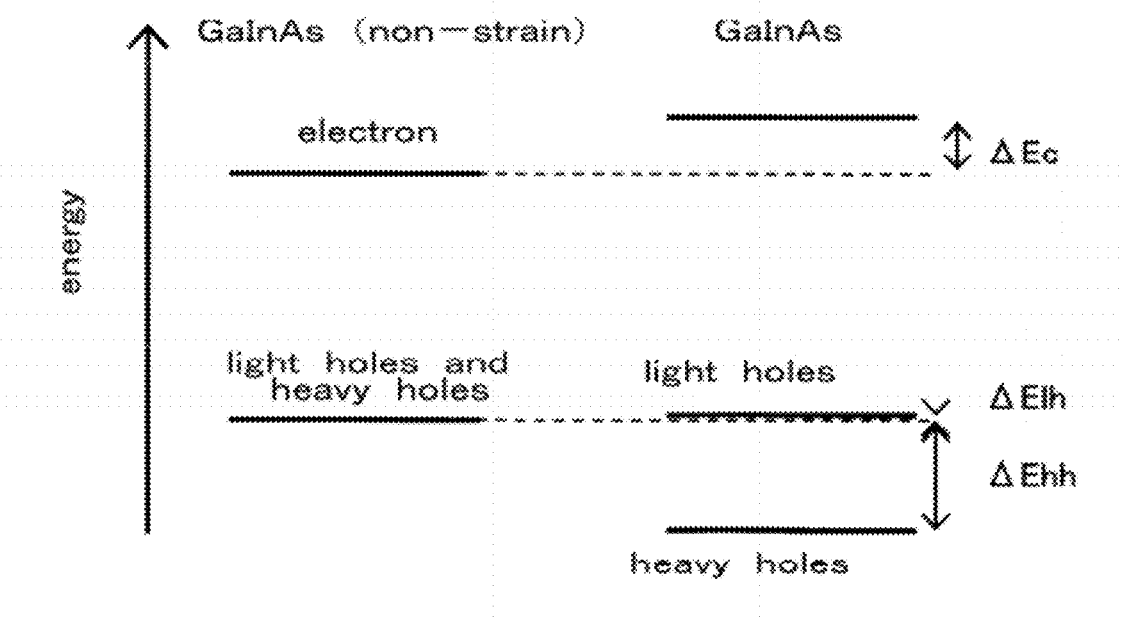

SEMICONDUCTOR OPTICAL AMPLIFIER, METHOD FOR MANUFACTURING THE SAME, AND SEMICONDUCTOR OPTICAL INTEGRATED DEVICE

CROSS REFERENCE TO RELATED APPLICATION

This application is based upon and claims the benefit of priority from the prior Japanese Patent Application NO. 2008-069735 filed on, Mar. 18, 2008, the entire contents of which are incorporated herein by reference.

FIELD

The embodiments discussed herein is related to a semiconductor optical amplifier (SOA) used in an optical communication system, a method for manufacturing the semiconductor optical amplifier, and a semiconductor optical integrated device.

BACKGROUND

In an optical communication system, due to external factors applied to optical fibers and/or various optical elements, the polarization state of signal light is not always constant but changes with time.

Hence, in order to always obtain a constant optical gain by an SOA provided in the optical communication system, an optical gain generated in the SOA is required to be constant regardless of the polarization state of input signal light.

As a technique to realize a polarization independent SOA, for example, the following two techniques have been disclosed.

First, a technique (hereinafter referred to as "first technique") has been disclosed in which in a semiconductor quantum well layer which is formed on an InP substrate and which is composed of a GaInAsP-based barrier layer and a GaInAsP-based well layer, the well layer receives no tensile stress in a in-plane direction but the barrier layer receives a tensile stress in the in-plane direction.

According to this first technique, when it is designed such that both the well layer and the barrier layer receive no tensile stress in the in-plane direction it is practically very difficult to make the amplification gain of the TM mode approximately equal to the amplification gain of the TE mode or larger than that by a certain value; hence, the structure described above has been used (see Japanese Laid-open Patent Publication No. hei4-27183).

In addition, in order to realize a polarization independent semiconductor optical amplifier in which the strain may not be increased larger than that of the first technique so as to obtain a desired effect, a technique has been disclosed (hereinafter referred to as "second technique") in which a strained multi-quantum well active layer formed on a GaAs substrate and composed of GaAsP well layers and GaAsP barrier layers or a strained multi-quantum well active layer formed on a GaAs substrate and composed of InGaAs well layers and GaAs barrier layers is used, and in which an in-plane tensile stress is applied to both the well layers and the barrier layers (see Japanese Laid-open Patent Publication No. hei6-244508).

Incidentally, in recent years, in the optical communication system, a wavelength division multiplexing (WDM) transmission system has been used in many cases. In addition, as one type of WDM transmission system, a coarse WDM (CWDM) transmission system in which signal lights are disposed at relatively wide wavelength intervals (such as 20 nm) has been increasingly used.

In order to correspond to the transmission systems described above, it has been desired to realize an SOA having polarization independent optical amplification characteristics over an entire wide wavelength band that WDM and/or CWDM optical signals use.

In addition, the SOA generally has a wide optical amplification wavelength band (gain band) and, for example, can collectively amplify a plurality of CWDM signal lights; however, in order to make an optical output of each signal light constant, it is preferable to make the optical gain constant over a wide wavelength band. That is, it has been desired to realize an SOA having a flat optical gain spectrum in a wide band.

For example, as a technique to realize a polarization independent semiconductor optical amplifier over a wide wavelength band, there has been a technique (hereinafter referred to as "third technique") capable of adjusting the difference in gain between TE polarization and TM polarization. According to this third technique, a plurality of InGaAsP active layers having different bandgap wavelengths are formed on an InP substrate, a wavelength band is increased by overlapping gain spectra of different wavelength bands obtained from the InGaAsP active layers, and a tensile strain is applied to each InGaAsP active layer while no strain is applied to InGaAsP barrier layers provided between the InGaAsP active layers (see Japanese Laid-open Patent Publication No. 2002-16322).

However, the above first and the second techniques are a technique to simply realize a polarization independent SOA, and it has not been taken into consideration to obtain polarization independent optical amplification characteristics over a wide wavelength band that, for example, WDM and/or CWDM optical signals use or over an entire region of a wide gain band (wavelength band) of the SOA, or it has not been taken into consideration to obtain a flat gain spectrum in a wide band.

In addition, although the third technique is a technique to realize a polarization independent semiconductor optical amplifier over a wide wavelength band, since the wavelength band is increased by overlapping gain spectra having different shapes, it has been difficult to obtain a flat gain spectrum in a wide band.

SUMMARY

According to an aspect of the embodiments, a semiconductor optical amplifier includes: a multi-quantum well active layer which is formed on an InP substrate and which includes well layers and barrier layers alternately laminated to each other, and in the above semiconductor optical amplifier, the well layers and the barrier layers each have a in-plane tensile strain, and the tensile strain of each of the barrier layers is larger than the tensile strain of each of the well layers.

The object and advents of the embodiments will be realized and attained by means of the elements and combinations particularly pointed out in the claims.

It is to be understood that both the foregoing general description and the following detailed description and are exemplary and explanatory and are not restrictive of the embodiments, as claimed.

BRIEF DESCRIPTION OF THE DRAWINGS

FIG. 5 is a view showing the relationship between tensile strain and an energy shift of the semiconductor optical amplifier according to the first embodiment;

FIG. 12 is a view showing the relationship between tensile strain and an energy shift of the semiconductor optical amplifier according to the related second technique;

DESCRIPTION OF THE PREFERRED EMBODIMENTS

Hereinafter, with reference to drawings, a semiconductor optical amplifier, a semiconductor optical integrated device, and methods for manufacturing them, according to the embodiments will be described.

First Embodiment

First, a semiconductor optical amplifier according to the first embodiment and a method for manufacturing the same will be described with reference to FIGS. 1 to 13.

The semiconductor optical amplifier according to this embodiment is a polarization independent semiconductor optical amplifier (SOA) which has an input port inputting signal light and an output port outputting signal light, which functions to amplify optical intensity of input signal light by stimulated emission generated in an active layer in the element, and which is formed on an InP substrate.

The polarization independent SOA described above itself may be used, for example, as an in-line amplifier, a booster amplifier, or a pre-amplifier in an optical communication system and may also be widely used as an active element mounted in a semiconductor optical integrated circuit of an optical gate switch, an optical signal processing element, or the like.

Figure 2:
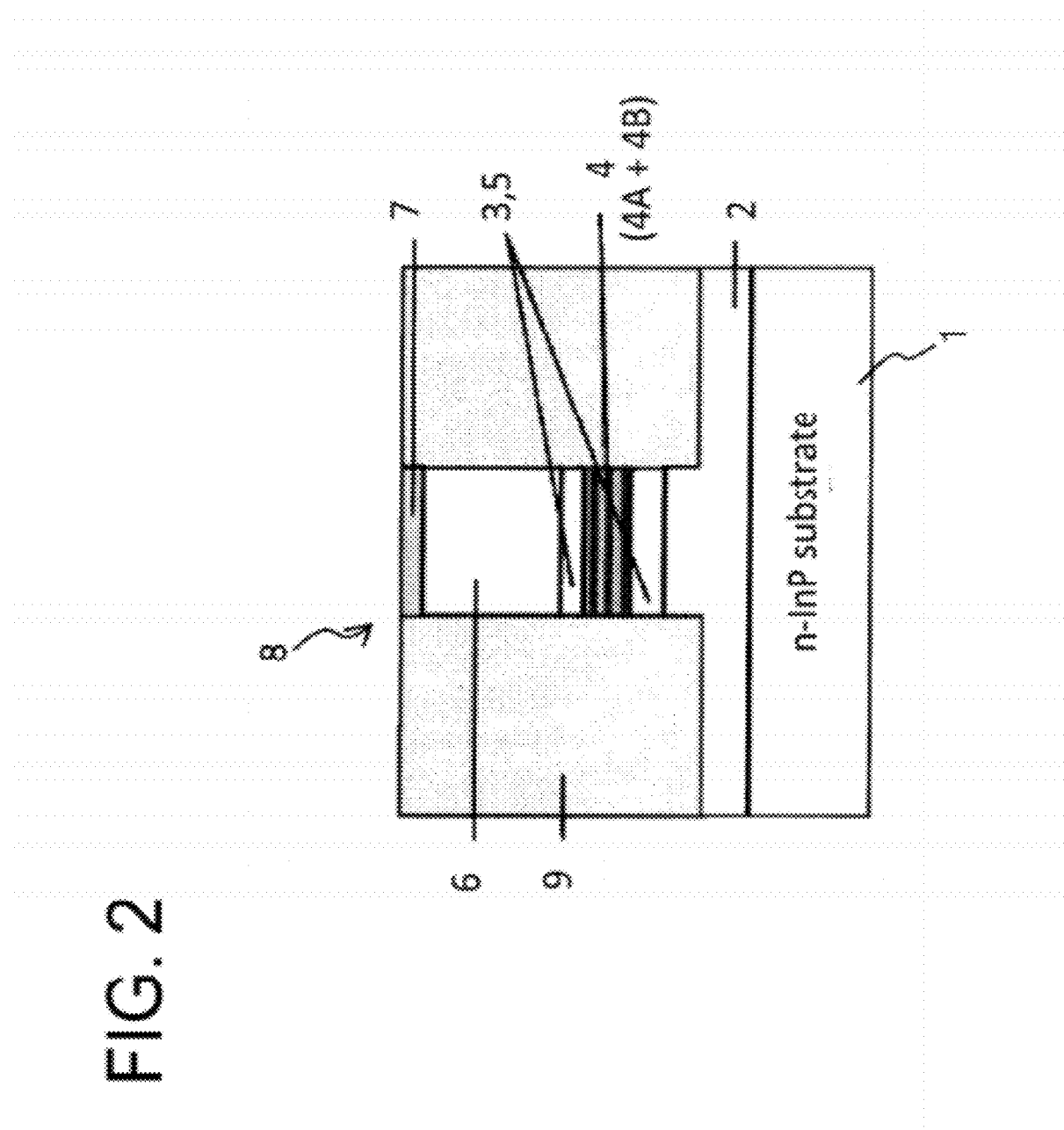
FIG. 2 is a schematic cross-sectional view illustrating the structure of the semiconductor optical amplifier according to the first embodiment and also illustrating a method for manufacturing the same.

As shown in FIG. 2, this SOA includes an active layer (MQW active layer) 4 which is formed on an InP substrate 1 and which has a multi-quantum well (MQW) structure including a GaInAsP-based semiconductor material ($Ga_xIn_{1-x}As_yP_{1-y}$, $0 \leq x \leq 1$, $0 \leq y \leq 1$)).

In this embodiment, the GaInAsP-based MQW active layer 4 has an MQW structure in which GaInAsP-based ($Ga_xIn_{1-x}As_yP_{1-y}$, $0 \leq x \leq 1$, $0 \leq y \leq 1$)) well layers 4A and GaInAsP-based ($Ga_xIn_{1-x}As_yP_{1-y}$, $0 \leq x \leq 1$, $0 \leq y \leq 1$)) barrier layers 4B are alternately laminated to each other.

In particular, as shown in FIG. 2, this SOA has a semiconductor laminate structure in which an n-InP clad layer 2, an i-GaInAsP-SCH (separate confinement heterostructure) layer (optical guide layer) 3, a strained MQW active layer 4 in which $Ga_{0.48}In_{0.52}As$ well layers 4A (tensile strain: 0.10%, thickness: 5 nm) and $Ga_{0.58}In_{0.42}As$ barrier layers 4B (tensile strain: 0.80%, thickness of 5 nm) are alternately grown 6 times, an i-GaInAsP-SCH layer 5, a p-InP clad layer 6, and a p-GaInAs contact layer 7 are laminated in that order on the n-InP substrate 1, and a mesa structure 8 formed from this semiconductor laminate structure is buried by semi-insulating InP block layers (high resistance InP layers, SI-InP layers) 9, so that a high resistance current confinement structure is formed (high resistance buried-heterostructure type SOA).

That is, in this embodiment, the well layer 4A and the barrier layer 4B each have a tensile strain, and the tensile strain of the barrier layer 4B is set larger than that of the well layer 4A. Hence, the MQW active layer is also called a strained MQW active layer.

In addition, in this embodiment, the well layer 4A and the barrier layer 4B are formed from the same semiconductor material ($Ga_xIn_{1-x}As$ ($0 \leq x \leq 1$)) of different composition. With this configuration, the control accuracy of strain in well layer 4A and barrier layer 4B can be increased during the epitaxial growth of MQW active layer using, for example, MOCVD. Furthermore, the control accuracy of strain can be greatly increased by adopting a well layer 4A and a barrier layer 4B which have same group V atoms (As, P . . . ) compositions, as is used in above embodiment (As=1, P=0). By using above configuration, not only the control parameter of composition at well and barrier layers can be reduced but also the unfavorable effect of displacement between group V atoms (As, P) can be suppressed during the epitaxial growth. Both effects offer the high control accuracy of composition and the strain in a well layer 4A and a barrier layer 4B.

Furthermore, in this embodiment, the well layers 4A are formed from the same semiconductor material and also have the same composition. In addition, the barrier layers 4B are formed from the same semiconductor material and also have the same composition.

In particular, in this embodiment, since the tensile strains are applied to the well layers 4A and the barrier layers 4B as described above, energy levels of electrons, heavy holes, and light holes of the well layer 4A and the barrier layer 4B can be adjusted independently of each other.

Figure 1:
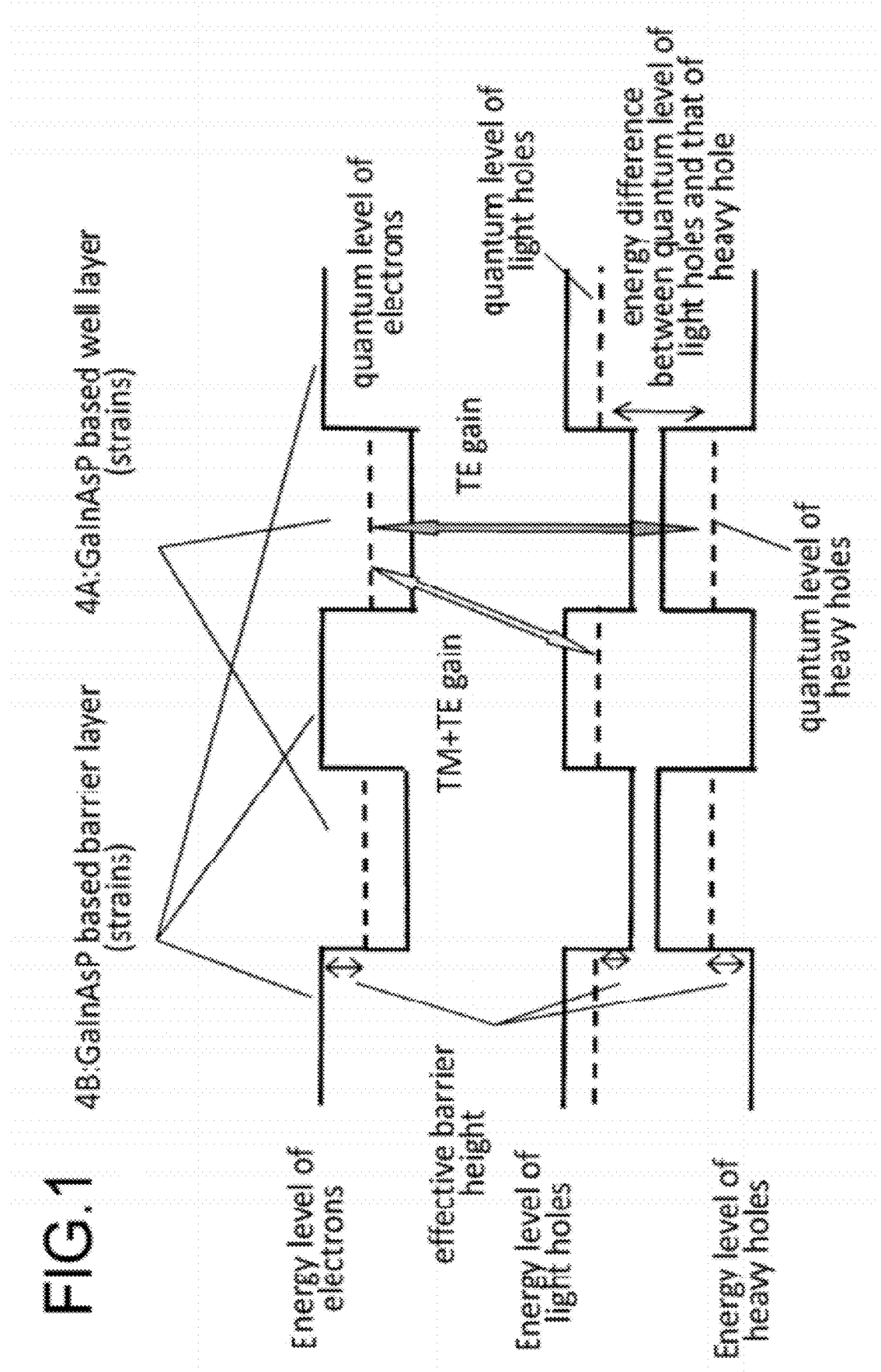
FIG. 1 is a schematic view showing an energy band structure of an active layer provided in a semiconductor optical amplifier according to a first embodiment.

FIG. 1 shows an energy band structure of the strained MQW active layer 4 of this SOA.

In FIG. 1, potential energy distributions of electrons and holes in the strained MQW active layer 4 are schematically shown, and toward an upper side in FIG. 1, the energy of electrons is increased and the energy of holes is decreased. In addition, in this embodiment, the well layer 4A and the barrier layer 4B forming the strained MQW active layer 4 are defined as a layer of low electron energy and a layer of high electron energy, respectively.

In this embodiment, the tensile strains are applied to both the well layers 4A and the barrier layers 4B of the strained MQW active layer 4. Hence, as shown in FIG. 1, over the entire region of the strained MQW active layer 4, the energy level of the valence band is separated into two levels, that is, an energy level of light holes and an energy level of heavy holes, and the energy level of light holes is present below the energy level of heavy holes.

In addition, in this embodiment, the tensile strain applied to the barrier layer 4B is set larger than that applied to the well layer 4A. Hence, as shown in FIG. 1, the energy level of heavy holes and the energy level of electrons (energy level of the conduction band) of the well layer 4A are lower than those of the barrier layer 4B by approximately several tens of meV, and a so-called type I quantum well structure is formed. On the other hand, the energy level of light holes of the barrier layer 4B is lower than that of the well layer 4A by approximately several tens of meV, and the energy level of light holes and the energy level of electrons form a so-called type II quantum well structure.

In particular, in this embodiment, since the energy levels of electrons, heavy holes, and light holes of the well layer 4A and the barrier layer 4B can be adjusted independently of each other, the difference in energy between the quantum level of light holes and that of heavy holes (see FIG. 1) and respective effective barrier heights of electrons, heavy holes, and light holes (heights of energy barriers with respect to the respective quantum levels of electrons, heavy holes, and light holes; see FIG. 1) can be controlled independently of each other.

In this embodiment, the difference in energy between the quantum level of light holes and that of heavy holes is a parameter for adjusting the presence ratio between light holes and heavy holes in the quantum well, and by adjusting this parameter, a polarization dependent gain (hereinafter referred to as "PDG" in some cases), which is an index indicating the polarization dependence of the optical gain generated in the SOA, can be decreased.

In addition, the effective barrier height is a parameter for determining the shape of a gain spectrum and the shape of a PDG spectrum indicating wavelength dependency of the PDG, and by adjusting this parameter, a flat gain spectrum and PDG spectrum can be realized over a wide wavelength range.

The PDG is defined by the difference between a maximum gain and a minimum gain of the SOA with respect to polarization states of various input signal lights. In general, in the SOA, since one of the TE and the TM modes, which are linear polarization modes perpendicular to each other, shows the maximum gain, and the other mode shows the minimum gain, the PDG can be represented by |TE gain−TM gain|.

The polarization independent optical amplification characteristics of the SOA indicates that the value of this PDG is small (such as 1 dB or less), and the polarization independent optical amplification characteristics over a wide wavelength band indicates that the value of the PDG is small and the PDG spectrum is flat over a wide wavelength band.

In addition, the optical gain (dB scale) of the SOA is proportional to the product of a material gain generated in the active layer and an optical confinement factor of the active layer with respect to the optical waveguide mode.

In a general SOA, by TE/TM polarization dependency of the material gain of a semiconductor material forming an active layer and the difference in optical confinement factor between TE and TM polarizations caused by an asymmetrical shape of the active layer, the optical gain with respect to TE polarization signal light (hereinafter referred to as "TE gain") tends to be larger than the optical gain with respect to TM polarization signal light (hereinafter referred to as "TM gain").

In this embodiment, since the tensile strains are applied to both the well layer 4A and the barrier layer 4B, the material gain can be made such that the TM gain is larger than the TE gain, and when the difference in optical confinement factor between the TE and TM polarizations (optical confinement factor of the TE mode>optical confinement factor of the TM mode) is counteracted by this material gain relationship (TM gain>TE gain), a polarization independent optical gain can be realized.

As described above, in this embodiment, since the difference in energy between the quantum level of light holes and that of heavy holes and the effective barrier heights of electrons, heavy holes, and light holes can be adjusted independently of each other, a small PDG can be realized, and in addition, a flat gain spectrum and PDG spectrum can be realized over a wide wavelength region.

Figure 3:
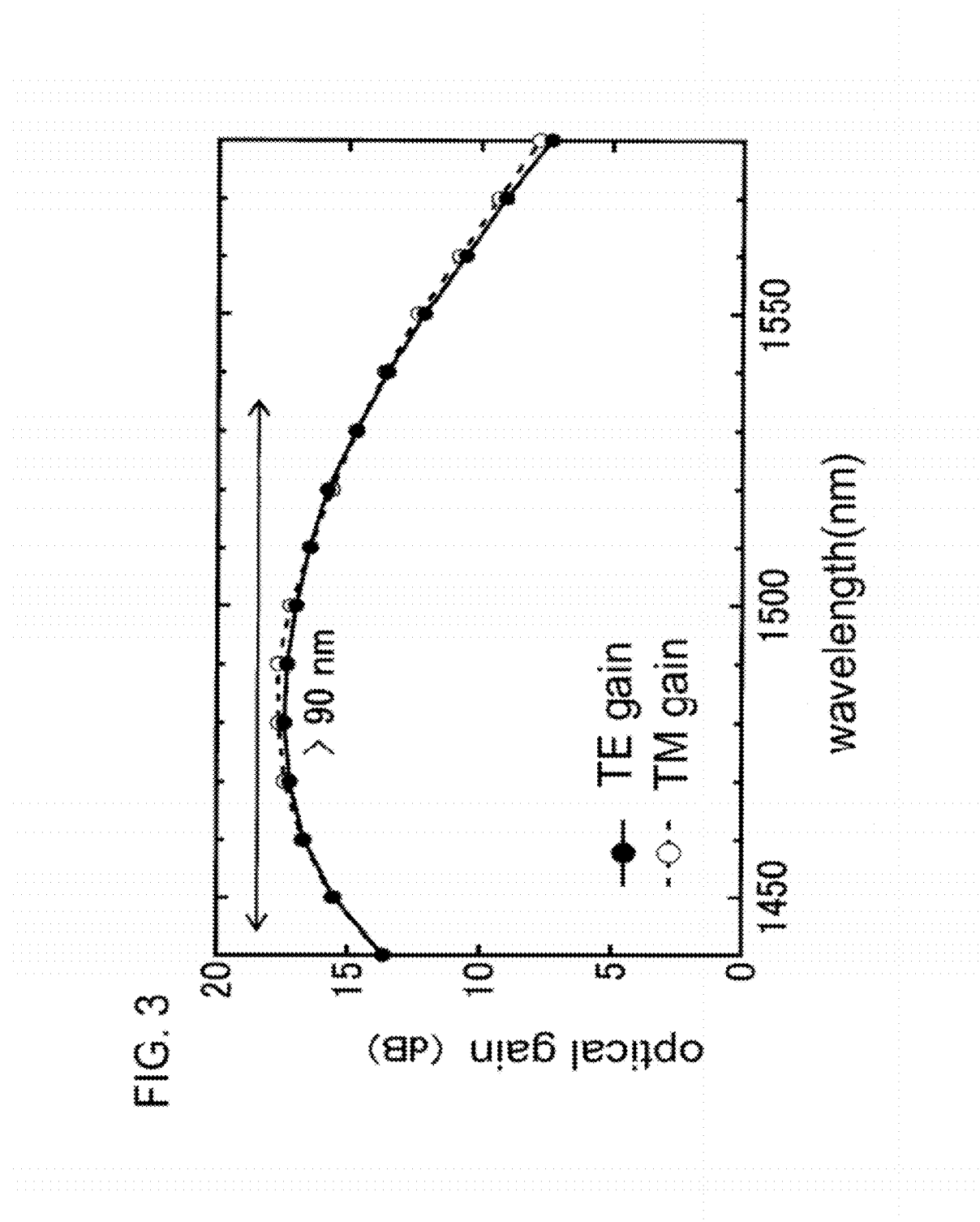
FIG. 3 is a graph showing gain properties (TE gain spectrum and TM gain spectrum) of the semiconductor optical amplifier according to the first embodiment.

In the structure of the above embodiment, the effective barrier heights of electrons, light holes, and heavy holes are adjusted to approximately 5 to 20 meV (in this case, the effective barrier height $\Delta Ec$ of electrons is 19.1 meV, the effective barrier height $\Delta Evlh$ of light holes is 6.1 meV, and the effective barrier height $\Delta Evhh$ of heavy holes is 8.1 meV), and further the difference in energy between the quantum level of light holes and that of heavy holes may be adjusted to approximately 23 mev. Accordingly, as shown in FIG. 3, the shape of a gain spectrum of the TE gain and the shape of a gain spectrum of the TM gain can be made approximately equivalent to each other (that is, a small PDG can be realized), a flat gain spectrum can be realized over a wide wavelength band, and as shown in FIG. 4, a flat PDG spectrum can also be realized over a wide wavelength band.

In this SOA, by the effect of the tensile strain applied to the well layer 4A, the effective barrier height of heavy holes is decreased (in this case, $\Delta Evhh$ is 8.1 meV), and the quantum effect in the active layer 4 is decreased; hence, a concave shape of the gain spectrum of the TE gain is smoothed. As a result, as shown in FIG. 3, the shape of the gain spectrum of the TE gain and the shape of the gain spectrum of the TM gain are made approximately equivalent to each other, and hence a small PDG can be realized. That is, as shown in FIG. 4, a convex shape of the PDG spectrum can be smoothed, and hence a flat PDG spectrum can be realized over a wide wavelength band.

Figure 4:
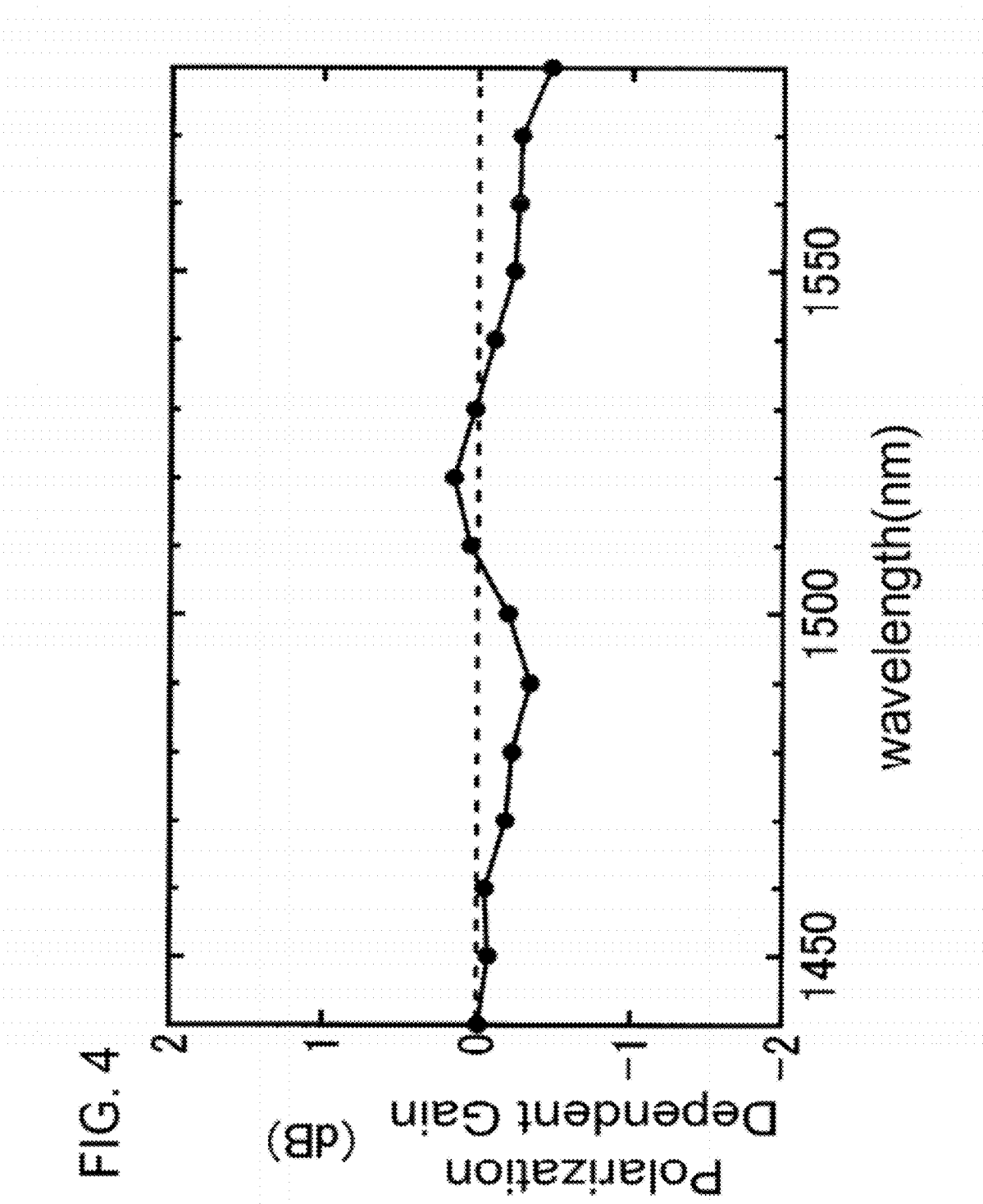
FIG. 4 is a graph showing the difference in gain between polarizations (PDG spectrum) of the semiconductor optical amplifier according to the first embodiment.

In the above structure of this embodiment, that is, in the structure in which the strained MQW active layer 4 including the $Ga_{0.48}In_{0.52}As$ well layers 4A (tensile strain: 0.10%, thickness of 5 nm) and the $Ga_{0.58}In_{0.42}As$ barrier layers 4B (tensile strain: 0.80%, thickness of 5 nm) is provided on the InP substrate 1, the value of the PDG is within the range of 10.5 dB (PDG<±0.5 dB) over a measured entire wavelength band (in this case, 1,400 to 1,580 mm) as shown in FIG. 4. In FIG. 4, for the convenience of illustration, TE>TM is represented by (+), and TE<TM is represented by (−).

That is, in the embodiment described above, by adjusting the tensile strains applied to the well layers 4A and the barrier layers 4B (and the thicknesses of the well layers 4A and the barrier layers 4B), the band structure can be adjusted.

Hence, the difference in energy between the quantum level of light holes and that of heavy holes, which relates to the PDG value, and the effective barrier heights of electrons, heavy holes, and light holes, which relate to the PDG spectrum, can both be optimized. As a result, the wavelength band in which polarization independent amplification characteristics can be obtained can be significantly increased, and a small PDG can be obtained in a wide wavelength band, for example, so as to cover the entire region of a gain band of the SOA.

For example, while the difference in energy between the quantum level of light holes and that of heavy holes is optimized by adjusting the tensile strain applied to the barrier layers so as to obtain a small PDG, the effective barrier heights of electrons, heavy holes, and light holes can also be optimized by adjusting the tensile strain applied to the well layers so as to obtain a flat PDG spectrum over a wide wavelength band.

Figure 8:
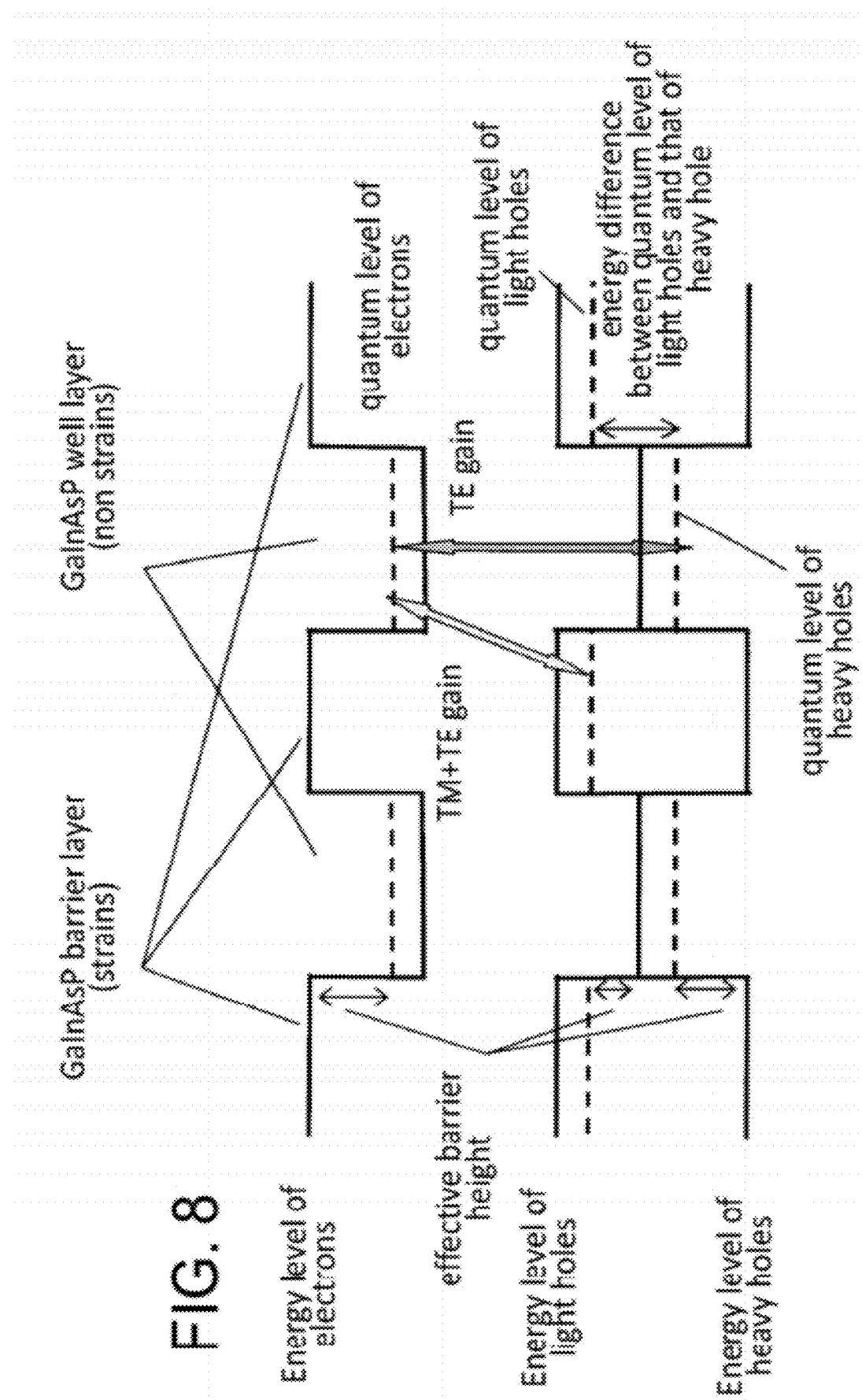
FIG. 8 is a schematic view showing an energy band structure of an active layer provided in a semiconductor optical amplifier according to a related first technique.

On the other hand, according to the above structure of the first technique, that is, according to the structure, for example, having a MQW active layer including non-strained $Ga_{0.47}In_{0.53}As$ well layers (thickness: 5 nm) and $Ga_{0.72}In_{0.28}As$ barrier layers (tensile strain: 1.7%, thickness: 5 nm) on an InP substrate, an energy band structure as shown in FIG. 8 is formed in which the effective barrier height $\Delta Ec$ of electrons is 76.7 meV, the effective barrier height $\Delta Evlh$ of light holes is 34.2 meV, and the effective barrier height $\Delta Evhh$ of heavy holes is 29.6 meV. In this case, the above values are obtained assuming that the structure other than the active layer structure is the same as that of this embodiment.

Accordingly, when the large effective barrier heights of heavy holes and light holes in the MQW active layer (in this case, $\Delta Evhh$=29.6 meV and $\Delta Evlhh$=34.2 meV) and the effective masses of the respective holes are taken into consideration, particularly in the heavy holes having a large mass, the quantum confinement effect in the active layer strongly works.

Figure 9:
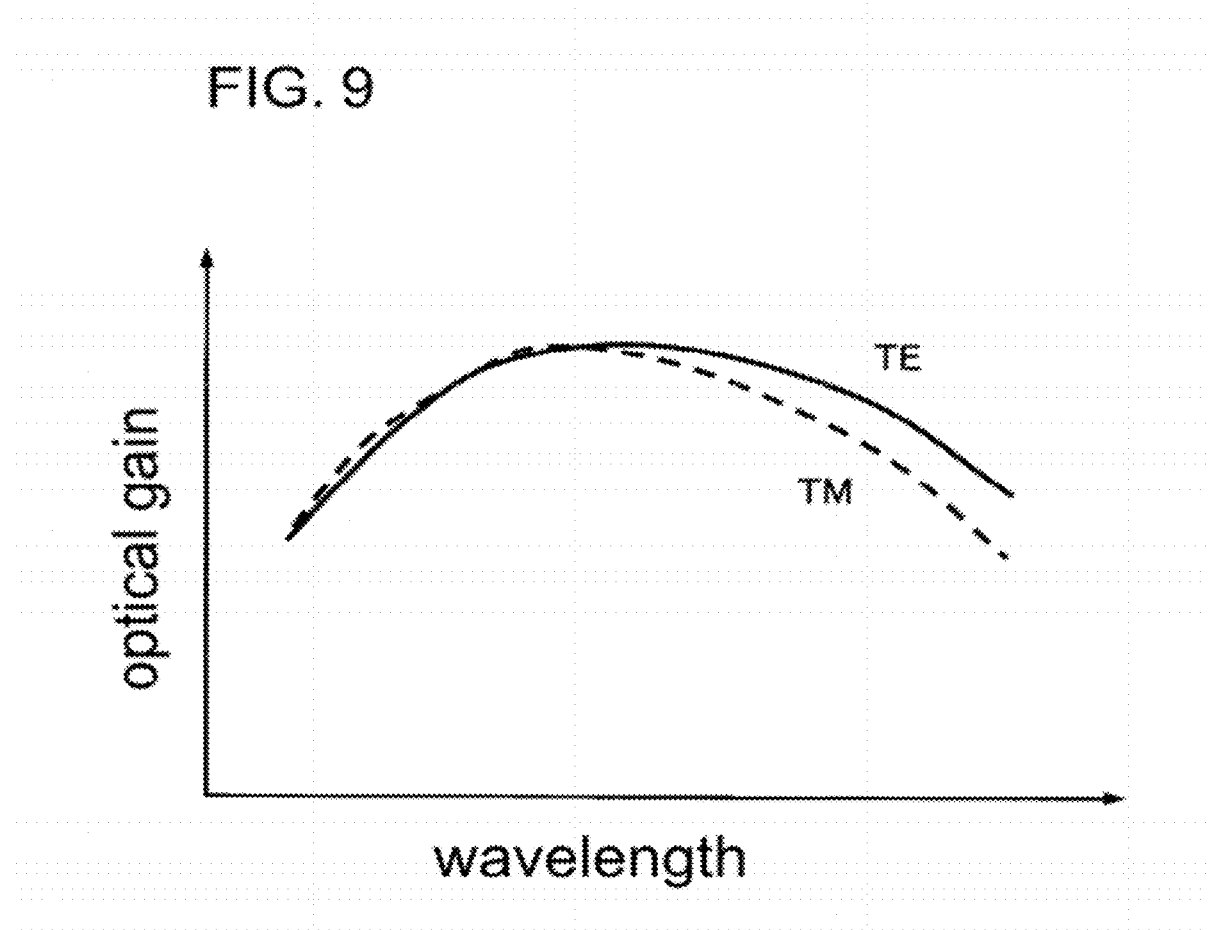
FIG. 9 is a graph showing gain properties (TE gain spectrum and TM gain spectrum) of the semiconductor optical amplifier according to the related first technique.
Figure 10:
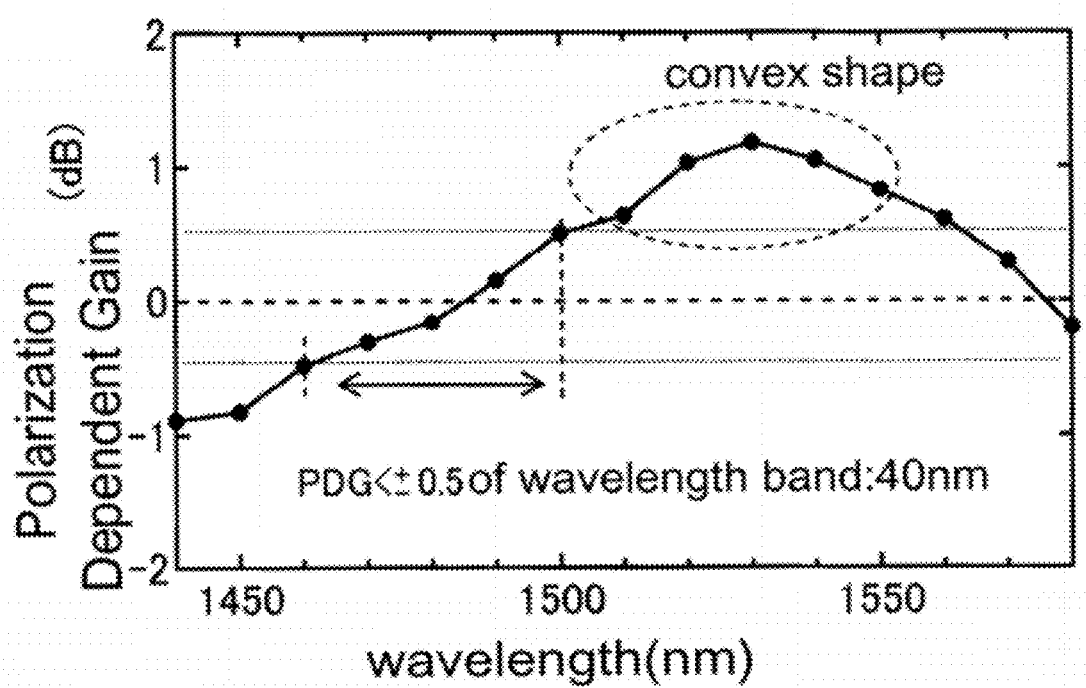
FIG. 10 is a graph showing the difference in gain between polarizations (PDG spectrum) of the semiconductor optical amplifier according to the related first technique.

As a result, as shown in FIG. 9, the gain spectrum of the TE gain has a slightly larger convex shape than that of the TM gain, and accordingly, as shown in FIG. 10, the PDG spectrum also shows a large convex shape. Hence, as shown in FIG. 10, the shape of the PDG spectrum cannot be made sufficiently flat over a wide wavelength band, and a wavelength band in which PDG<±0.5 dB holds (in FIG. 10, for the convenience of illustration, TE>TM is represented by (+), and TE<TM is represented by (−)) can be obtained is limited in a narrow wavelength band (in this case, 40 nm).

That is, according to the first technique described above, since the band structure is adjusted only by adjusting the tensile strain (besides the adjustment of the thicknesses of the well layers and the barrier layers) applied to the barrier layers, it is difficult to optimize both the difference in energy between the quantum level of light holes and that of heavy holes, which relates to the PDG value, and the effective barrier heights of electrons, heavy holes, and light holes, which relate to the PDG spectrum. As a result, although the tensile strain applied to the barrier layers is set so as to obtain a small PDG, the effective barrier heights become larger than desired values; hence, the quantum effect strongly works, and as a result, the PDG spectrum unfavorably has a large convex shape. Accordingly, even if the tensile strain applied to the barrier layers is adjusted variously many times, it is difficult to obtain a small PDG over a wide wavelength band, for example, so as to cover the entire region of a gain band of the SOA.

In the structure according to this embodiment, the strained MQW active layer 4 formed of the tensile strained GaInAs well layers 4A and the tensile strained GaInAs barrier layers 4B is grown on the InP substrate 1. That is, in the structure of this embodiment, as shown in FIG. 5, compared to the non-strained case, a semiconductor material (that is, a GaInAsP-based semiconductor material grown on the InP substrate) is used in which the energy levels of electrons, light holes, and heavy holes are all shifted in accordance with the tensile strain. In this embodiment, the well layer 4A and the barrier layer 4B are formed from a semiconductor material (that is, a GaInAsP-based semiconductor material grown on the InP substrate) in which in accordance with the tensile strain, the energy level of electrons is shifted to a high energy side, the energy level of light holes is shifted to a low energy side, and the energy level of heavy holes is shifted to a high energy side.

On the other hand, in the case in which a strained MQW active layer composed of tensile strained GaAsP well layers and tensile strained GaAsP barrier layers (or a strained MQW active layer composed of tensile strained GaAs barrier layers and tensile strained InGaAs well layers) is grown on a GaAs substrate as in the above second technique, as shown in FIG. 12, as compared to the non-strained case, although the energy level of electrons and that of heavy holes are shifted in accordance with the tensile strain, the energy level of light holes is hardly shifted even if the tensile strain is changed.

Figure 11:
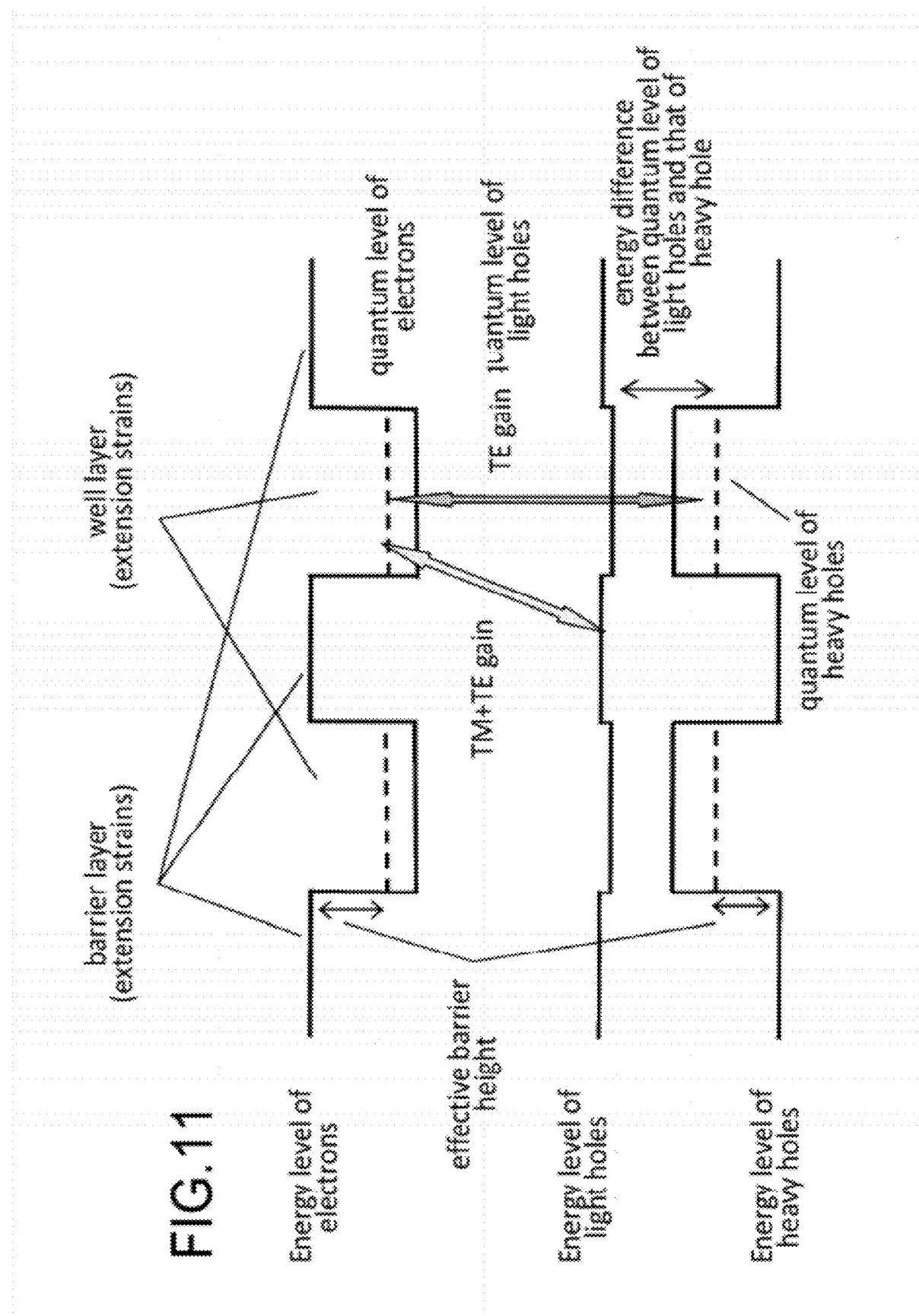
FIG. 11 is a schematic view showing an energy band structure of an active layer provided in a semiconductor optical amplifier according to a related second technique.

In the structure as that of the second technique in which, for example, a strained MQW active layer composed of $GaAs_{0.3}P_{0.1}$ well layers (tensile strain: 0.3%, thickness: 6 nm) and $GaAs_{0.75}P_{0.25}$ barrier layers (tensile strain: 0.9%, thickness: 7 nm), although the energy level of heavy holes and that of electrons form a so-called type I quantum well structure in the active layer as shown in FIG. 11, due to the difference in band offset between the case in which semiconductor layers are grown on an InP substrate and the case in which semiconductor layers are grown on a GaAs substrate, the difference in energy level between the barrier layer and the well layer is only several meV; hence, the energy level of light holes has an approximately flat band structure. In this case, the effective barrier height $\Delta Ec$ of electrons is 68 meV, the effective barrier height $\Delta Evlh$ of light holes is smaller than 1 meV, and the effective barrier height $\Delta Evhh$ of heavy holes is 11.5 meV.

Figure 13:
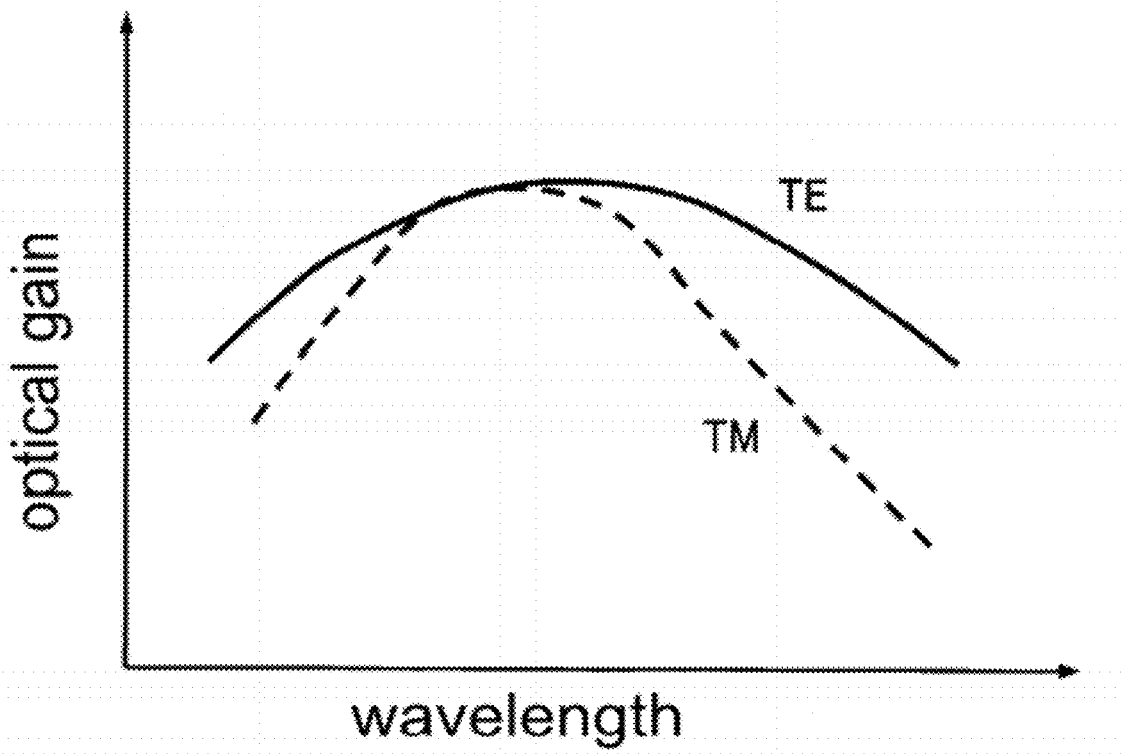
FIG. 13 is a graph showing gain properties (TE gain spectrum and TM gain spectrum) of the semiconductor optical amplifier according to the related second technique.

Accordingly, the heavy holes have an effective barrier height of approximately several tens of meV, and the height thereof can be adjusted by changing the strain and the thickness; however, the effective barrier height of light holes is fixed to approximately zero regardless of the strain and the thickness. That is, it is difficult to form a quantum well structure in which the energy level of light holes in an active layer is sufficiently high. Hence, as shown in FIG. 13, the spectrum shape of the TM gain to which light holes relate and the spectrum shape of the TE gain to which heavy holes primarily relate are made significantly different from each other. As a result, it is difficult to realize a small PDG over a wide wavelength band. That is, it is difficult to adjust the PDG spectrum to be sufficiently flat over a wide wavelength band.

According to the structure of this embodiment, as shown in FIG. 3, for both the TE gain and the TM gain, a very wide band of 90 nm or more can be realized as a 3-dB gain wavelength band (wavelength band in which a gain of 3 dB can be obtained with respect to the highest gain). That is, according to the structure of this embodiment, the TE gain and the TM gain can both obtain flat gain spectra over a wide band.

The reason for this is that according to the structure of this embodiment, in the energy bands of electrons, light holes, and heavy holes in the active layer 4, the respective single quantum levels are formed as shown in FIG. 1.

On the other hand, according to the third technique described above, since the optical gain of the SOA is obtained by overlapping two types of gain spectra having different shapes, the wavelength band can be increased; however, it is difficult to obtain a flat gain spectrum in a wide band.

In the structure of this embodiment, although the tensile strain of the GaInAs well layer 4A is set to 0.10%, and the tensile strain of the GaInAs barrier layer 4B is set to 0.80%, the tensile strains are not limited thereto, and when the tensile strain applied to the well layer is 0.05% or more (when the tensile strain is represented by minus, and the compression strain is represented by plus, the strain is −0.05% or more), a small PDG can be realized over a wide wavelength band.

Figure 6:
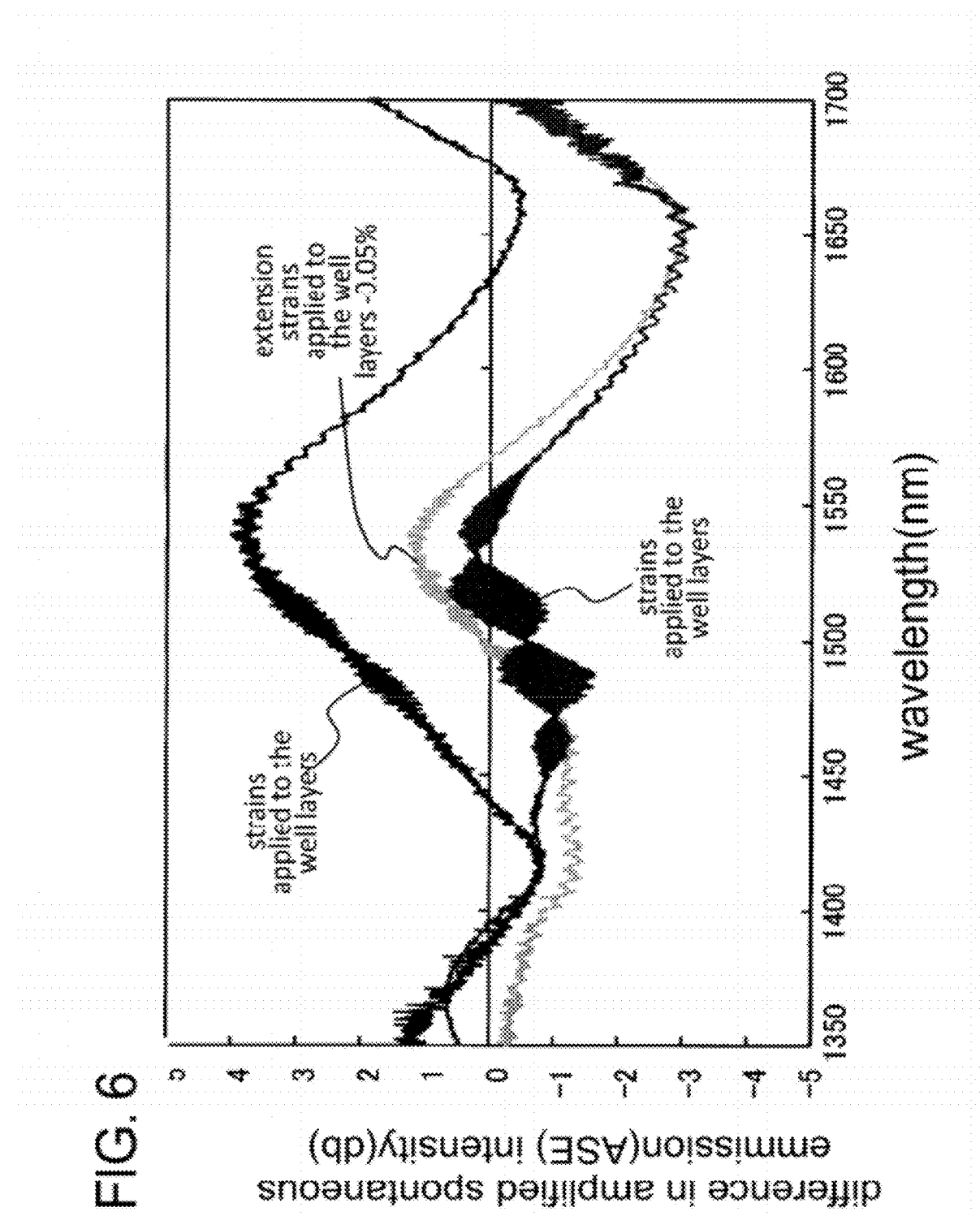
FIG. 6 is a graph showing the relationship between the difference in ASE intensity between polarizations (PDG spectrum) and tensile strain of a well layer of the semiconductor optical amplifier according to the first embodiment.

FIG. 6 shows the difference in amplified spontaneous emission (ASE) intensity between polarizations of each of SOAs in which the tensile strains applied to the well layers are 0.10%, 0.05%, and 0%.

Since the difference in ASE intensity between polarizations represented by the vertical axis of FIG. 6 is a measurement value relating to the PDG of the SOA, the spectrum shown in FIG. 6 is approximately equivalent to the PDG spectrum of the SOA. In addition, in this embodiment, in order to more specifically investigate the effect of the change of the difference in ASE strength between polarizations with respect to the tensile strain of the well layer, the comparison is performed using an element in which the total thickness of the active layer is increased than that of the particular structural example of the embodiment described above so as to increase the optical gain (element in which the PDG more sensitively responds to the strain). Hence, the PDG of the particular structural example of the above embodiment and the absolute value of the difference in ASE intensity between polarizations shown in FIG. 6 do not coincide with each other.

As shown in FIG. 6, compared to the PDG spectrum at a tensile strain applied to the well layer of 0%, in the PDG spectra at tensile strains applied to the well layer of 0.10% and 0.05%, the convex shape at a wavelength of approximately 1,550 nm is significantly smoothed. Hence, when the tensile strain applied to the well layer is set to 0.05% or more (preferably 0.10% or more), a flat PDG spectrum can be obtained over a wide wavelength band.

In addition, in order to obtain a small PDG, the tensile strain applied to the barrier layer is preferably set to 0.05% or more. However, the tensile strain applied to the barrier layer 4B must be set larger than that applied to the well layer 4A.

Incidentally, an SOA used, for example, in an optical communication system is required to have a high saturation output power.

In addition, when a high-speed modulated optical signal transmitted by an optical communication system is amplified by an SOA, due to a phenomenon, a so-called pattern effect, caused by a high-speed gain response in the SOA, the waveform of the modulated optical signal is degraded, and as a result, the communication quality is seriously degraded. This pattern effect generated in the SOA is significantly generated particularly in a high optical output power region in which the optical gain of the SOA is saturated.

Hence, when an SOA is used in an optical communication system, in order to suppress the pattern effect even at a high optical output level and to favorably amplify a modulated optical signal, it is necessary to increase a saturation output power (defined by an optical output of an SOA at which, for example, a gain saturation of 3 dB is generated) as large as possible which is an index indicating the gain saturation of the SOA.

In general, the saturation output power of an SOA has an inverse relationship with the thickness of the active layer, and in order to realize a sufficiently high saturation output power, the thickness of the active layer of the SOA must be at least decreased to 100 nm or less.

Accordingly, in the structure of this embodiment, the thickness of the well layer 4A is set to 5 nm, the thickness of the barrier layer 4B is set to 5 nm, and the total thickness of the MQW active layer 4 is set to 65 nm by alternately laminating the above layers 6 times, so that the saturation output power of this SOA is increased, and the pattern effect is suppressed even in a high optical output state, so that the modulated optical signal is preferably amplified. As a result, a high-output power SOA can be realized.

In the structure of this embodiment, although the total thickness of the MQW active layer 4 is set to 65 nm, it is not limited thereto, and the thickness of the active layer of the SOA may be set to 100 nm or less. In the case of an active layer having the MQW structure as in this embodiment, by adjusting the number of the well layers and the barrier layers alternately laminated to each other, the total thickness of the active layer can be easily adjusted.

In addition, in the structure of this embodiment, although the thickness of the well layer 4A is set to 5 nm, and the thickness of the barrier layer 4B is set to 5 nm, the above thicknesses are not limited thereto, and the thickness of the well layer and that of the barrier layer may be set to 10 nm or less.

As described above, when the thickness of the well layer and that of the barrier layer are set to 10 nm or less, energy of a high-order quantum level generated in the quantum well can be increased to a sufficiently higher energy side from that of the ground quantum level. As a result, even in a high-current injection state, the appearance of a peak shape on the gain spectrum due the contribution of the higher-order quantum level can be suppressed, and hence a flat gain spectral shape can be maintained.

On the other hand, according to the third technique described above, the total thickness of the active layer including a plurality of bulk active layers is increased, for example, to approximately 500 nm. In the structure as described above, it is believed that the total thickness of the active layer cannot be easily decreased while the polarization independent characteristics are maintained, and that a high saturation output power cannot be easily obtained.

Next, a method for manufacturing the semiconductor optical amplifier of this embodiment will be described with reference to FIG. 2.

First, the n-InP clad layer 2 (thickness: 200 nm) and the i-GaInAsP-SCH layer 3 (composition wavelength: 1.3 μm, thickness: 100 nm) are epitaxial-grown in that order on the n-type InP substrate 1, for example, by an organic metal vapor phase method (hereinafter referred to as "MOVPE method") (see FIG. 2).

In addition, on the layer described above, the tensile strained i-$Ga_{0.58}In_{0.42}As$ barrier layers 4B (tensile strain: 0.80%, thickness: 5 nm) and the tensile strained i-$Ga_{0.48}In_{0.52}As$ well layers 4A (tensile strain: 0.10%, thickness: 5 nm) are alternately grown 6 times, so that the strained MQW active layer 4 is formed (see FIG. 2).

As described above, the well layers 4A each having a tensile strain and the barrier layers 4B each having a tensile strain (in this case, tensile strain: 0.05% or more) larger than that of the well layers 4A (in this case, tensile strain: 0.05% or more) are alternately laminated to each other to form the MQW active layer 4.

In addition, as described above, as the well layers 4A, well layers having a thickness of 10 nm or less are formed, and as the barrier layers 4B, barrier layers having a thickness of 10 nm or less are formed. Accordingly, as the MQW active layer 4, an MQW active layer having a thickness of 100 nm or less is formed.

In addition, as described above, the well layers 4A and the barrier layers 4B are formed from the same semiconductor material of different compositions (that is, a GaInAsP-based semiconductor material), and the compositions of group V atoms in both well layers and barrier layers are set to the same. (As=1, P=0)

Furthermore, as described above, as the well layers 4A, a plurality of well layers is formed from the same semiconductor material to have the same composition, and as the barrier layers 4B, a plurality of barrier layers is formed from the same semiconductor to have the same composition.

In addition, the well layers 4A and the barrier layers 4B are each formed from a semiconductor material (that is, a GaInAsP-based semiconductor material grown on the InP substrate) in which in accordance with the tensile strain, the energy level of electrons is shifted to a high energy side, the energy level of light holes is shifted to a low energy side, and the energy level of heavy holes is shifted to a high energy side.

The i-GaInAsP-SCH layer 5 (composition wavelength: 1.3 μm, thickness: 100 nm), the p-InP clad layer 6 (thickness: 2,000 nm), and the p-GaInAs contact layer 7 (thickness: 500 nm or the like) are grown on the above active layer 4 (see FIG. 2).

After the semiconductor layers are epitaxial-grown as described above, for example, a $SiO_2$ film is formed on the surface thereof and is then patterned using a photo mask or the like to form a mesa stripe structure having a width, for example, of 2 μm, so that a $SiO_2$ mask is formed.

By using this $SiO_2$ mask, dry etching is performed by an ICP-RIE method or the like, so that the mesa structure 8 having a height, for example, of approximately 3 μm is formed (see FIG. 2).

Next, for example, by an MOVPE method, the semi-insulating InP block layers 9 (high resistance InP layers, SI-InP layers, In layers doped by Fe, Ru, or the like) is grown so as to bury the mesa structure 8, thereby forming a high resistance current confinement structure (semi-insulating buried heterostructure (SI-BH structure)) (see FIG. 2).

As described above, the epitaxial growth process is completed, so that an element cross-sectional structure as shown in FIG. 2 is formed.

In addition, by a process used for a general semiconductor laser, electrodes are formed on a top and a bottom surface of a wafer.

Subsequently, after the wafer provided with the electrodes are cleaved into arrays each having an element length of approximately 1 mm, anti-reflection coating is performed on two end cleaved surfaces thereof, so that anti-reflection films are formed. Furthermore, the array is cleaved into chips, so that the SOAs (SOA elements) are completed.

In the SOA having the structure as described above, spot-size converters of a width-tapered structure or a thickness-tapered structure may be provided at two ends of an optical waveguide, and by the converters, a semiconductor optical amplifier can be realized which can increase an optical mode diameter at the element end surface and which can be connected to an optical fiber with higher efficiency. In addition, when the anti-reflection films are formed at the two end surfaces as described above, and when the optical waveguide is formed to be inclined with respect to the element end surface, for example, by several degrees, an end-surface reflectance can be reduced, for example, to $1\times10^{-5}$ or less, and as a result, a semiconductor optical amplifier can be realized having flat amplification characteristics in which no ripples are present in a gain spectrum.

Hence, according to the semiconductor optical amplifier of this embodiment and the method for manufacturing the same, over a wide wavelength band, polarization independent optical amplification characteristics can be obtained, and a flat gain spectrum can also be advantageously obtained.

According to the structure of this embodiment described above, three advantages can be simultaneously obtained, that is, the PDG can be decreased over a wide wavelength band, a flat gain spectrum can be obtained over a wide wavelength band, and a high saturation output power can be obtained. In other words, while the gain spectrum of the SOA is maintained flat, a small PDG can be realized in an entire amplification wavelength band of the SOA, and in addition, by decreasing the thickness of the active layer, a high saturation output power can be realized.

In the embodiment described above, although the well layer and the barrier layer are formed from the same semiconductor material (GaInAs), they are not limited thereto, and the well layer and the barrier layer may be formed from different semiconductor materials. For example, the well layer and the barrier layer may be formed from different semiconductor materials which are categorized in a GaInAsP-based semiconductor material. From the aspect of control accuracy in strain and composition, however, it is preferable to use the same compositions of group V atoms (As, P) between well layers and barrier layers.

In addition, in the embodiment described above, although the case in which a GaInAsP-based semiconductor is used as the material for the well layer and the barrier layer is described by way of example, a GaInNAs-based semiconductor material ($Ga_xIn_{1-x}N_yAs_{1-y}$ ($0 \leqq x \leqq 1$, $0 \leqq x \leqq 1$)) or a AlGaInAs-based semiconductor material ($Al_xGa_yIn_{1-x-y}As_y$, ($0 \leqq x \leqq 1$, $0 \leqq y \leqq 1$)) may be used for both the well layer and the barrier layer or may be used for one of them. In addition, when the well layer and the barrier layer are both formed from a GaInNAs-based semiconductor material, they may be formed from different semiconductor materials categorized in the GaInNAs-based semiconductor material. By the structure described above, an effect similar to that obtained by using a GaInAsP-based semiconductor material can be realized, and furthermore, an optical gain at a longer wavelength side (longer wavelength side than a 1.55-μm band) can be obtained as compared to the case of using a GaInAsP-based semiconductor material.

In addition, in the embodiment described above, although the high-resistance buried type SOA is described by way of example, the waveguide structure is not limited thereto. For example, the embodiment can also be applied to an SOA having a p- and n-InP buried heterostructure current confinement structure (pn buried-heterostructure type SOA).

Figure 7:
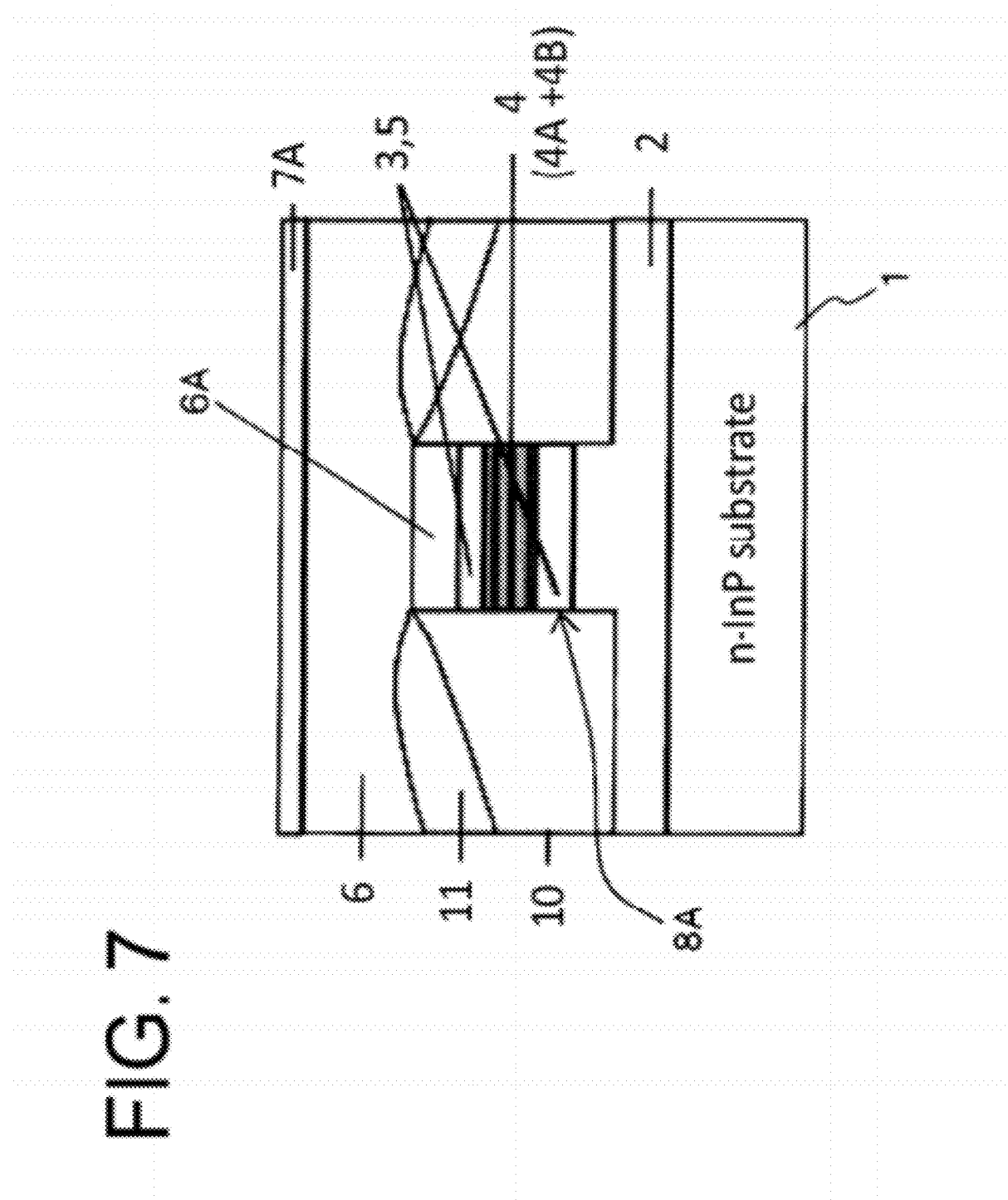
FIG. 7 is a schematic cross-sectional view illustrating the structure of a semiconductor optical amplifier of a modified example according to the first embodiment and also illustrating a method for manufacturing the same.

In this case, as shown in FIG. 7, the pn buried heterostructure type SOA has a semiconductor laminate structure in which the n-InP clad layer 2, the i-GaInAsP-SCH layer 3, the strained MQW active layer 4 in which the $Ga_{0.48}In_{0.52}As$ well layers 4A (tensile strain: 0.10%, thickness: 5 nm) and the $Ga_{0.58}In_{0.42}As$ barrier layers 4B (tensile strain: 0.80%, thickness of 5 nm) are alternately grown 6 times, the i-GaInAsP-SCH layer 5, p-InP clad layers 6A and 6B, and a p-GaInAs contact layer 7A are laminated in that order on the InP substrate 1, and a mesa structure 8A is buried by p-InP block layers 10 and n-InP block layers 11, so that a pn buried heterostructure current confinement structure is formed. In FIG. 7, the same elements as those in the above embodiment (see FIG. 2) are designated by the same reference numerals.

Hereinafter, a method for manufacturing the pn buried heterostructure type SOA will be described with reference to FIG. 7.

First, the n-InP clad layer 2 (thickness: 200 nm) and the i-GaInAsP-SCH layer 3 (composition wavelength: 1.3 µm, thickness: 100 nm) are epitaxial-grown in that order on the n-type InP substrate 1, for example, by an MOVPE method (see FIG. 7).

In addition, on the layer described above, the tensile strained i-$Ga_{0.58}In_{0.42}As$ barrier layers 4B (tensile strain: 0.80%, thickness: 5 nm) and the tensile strained i-$Ga_{0.48}In_{0.52}As$ well layers 4A (tensile strain: 0.10%, thickness: 5 nm) are alternately grown 6 times, so that the strained MQW active layer 4 is formed (see FIG. 7).

The i-GaInAsP-SCH layer 5 (composition wavelength: 1.3 µm, thickness: 100 nm) and the p-InP clad layer 6A (thickness: 200 nm) are grown on the above active layer 4 (see FIG. 7).

As described above, after the semiconductor layers are epitaxial-grown, for example, a $SiO_2$ film is formed on the surface thereof and is then patterned using a photo mask or the like to form a mesa stripe structure having a width, for example, of 2 µm, so that a $SiO_2$ mask is formed.

By using this $SiO_2$ mask, dry etching is performed by an ICP-RIE method or the like, so that the mesa structure 8A having a height, for example, of approximately 1.5 µm is formed (see FIG. 7).

Next, for example, by an MOVPE method, the p-InP block layers 10 and the n-InP block layers 11 are grown in that order so as to bury the mesa structure 8A, and as a result, the pn buried heterostructure current confinement structure is formed (see FIG. 7).

Next, after the $SiO_2$ mask is peeled off, the p-InP clad layer 6B is additionally grown, and the p-GaInAs contact layer 7A is further grown.

As described above, the epitaxial growth process is completed, so that an element cross-sectional structure as shown in FIG. 7 is formed.

Hereinafter, through a process similar to that in the above embodiment, the SOA (SOA element) is completed.

Second Embodiment

First, a semiconductor optical integrated device of the second embodiment and a method for manufacturing the same will be described with reference to FIGS. 14 and 15A to 15F.

The semiconductor optical integrated device of this embodiment has the structure in which semiconductor optical amplifiers (SOA) each according to the above first embodiment and/or the modified example thereof, an optical coupler, and optical waveguides are integrally provided on the same substrate.

Hereinafter, as the semiconductor optical integrated device including the semiconductor optical amplifiers of the above first embodiment and/or the modified example thereof, the optical coupler, and the optical waveguides which are integrated as described above, an SOA optical gate array integrated device will be described by way of example.

The SOA optical gate array integrated device of this embodiment is mounted on a mounting substrate together with a wiring substrate, a lens array, and the like and forms an SOA optical gate switch (optical module, in this embodiment, 8×1-channel SOA optical gate switch).

Figure 14:
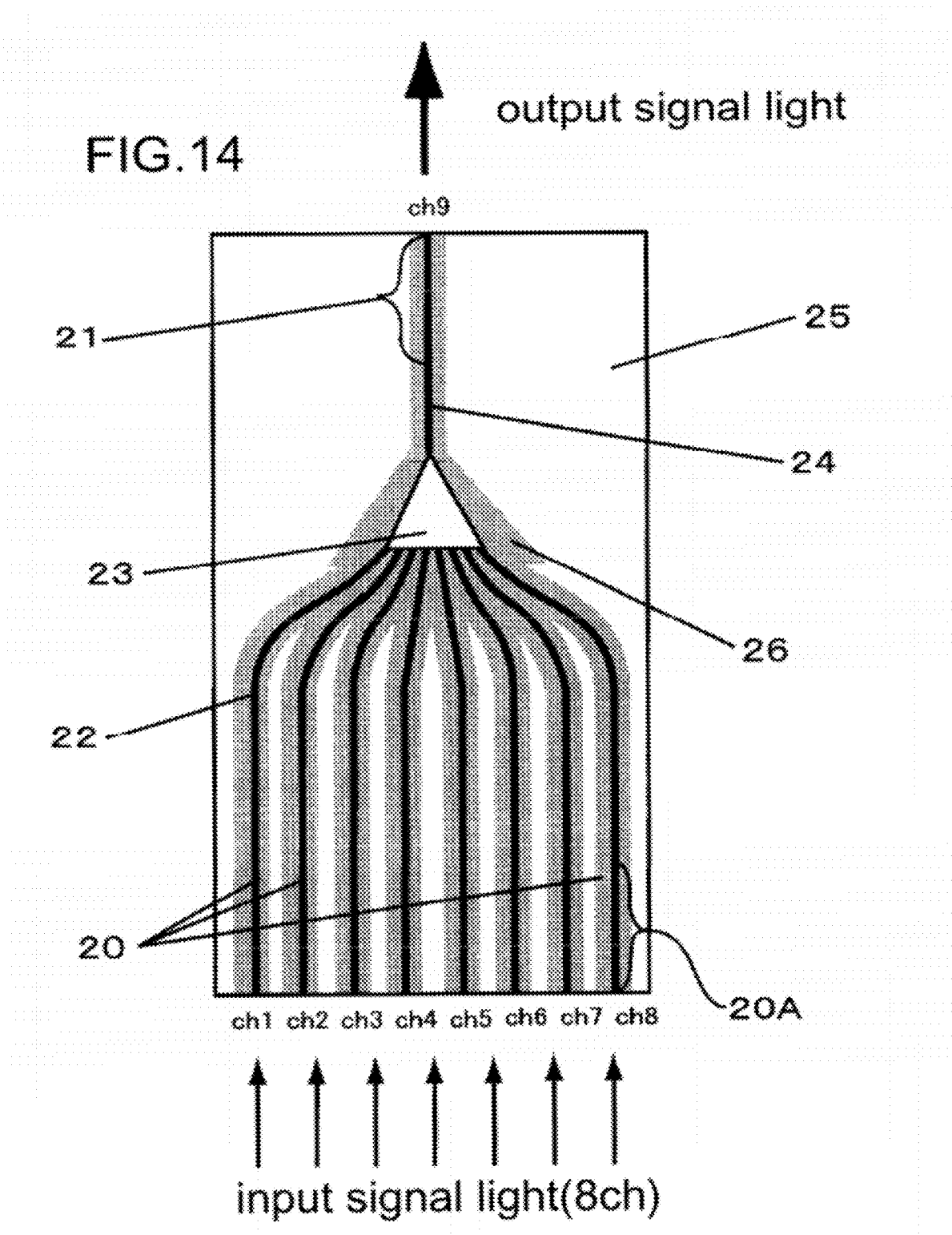
FIG. 14 is a schematic plan view showing the structure of a semiconductor optical integrated device according to a second embodiment.

For example, as shown in FIG. 14, this SOA optical gate switch has an 8×1-channel optical gate switching function in which one signal light is selected from 8 signal lights (input signal lights) input to respective SOAs 20A forming an SOA gate array (8-channel SOA array) 20 through 8 input port channels 1 to 8, is amplified by an SOA (1-channel SOA) 21, and is output as an output signal light from one output port channel 9.

That is, in this SOA optical gate switch, among the 9 SOAs, current is simultaneously injected into the channel SOA 21 and one of the SOAs 20A (one SOA provided in one of the 8 input port channels 1 to 8) which is provided in one selected port and which forms the 8-channel SOA array 20 to give an optical gain to a signal light transmitting through the optical path, and at the same time, no current is injected into the remaining 7 SOAs 20A of the 8-channel SOA array 20 (remaining 7 SOAs provided in the remaining ports of the 8 input port channels 1 to 8). Accordingly, by using a high absorption factor of the SOAs, signal lights transmitting through the other optical paths are quenched, so that the optical gate switching function is realized.

As described above, in the SOA optical gate switch, the SOA generates the optical gain when current is injected but absorbs light with very high efficiency when current is not injected, and by using the above properties, the optical gate function is realized by performing ON/OFF of current which is injected into the SOA.

This SOA gate array integrated device is an SOA gate array integrated device (8×1-channel SOA gate array integrated device) having 8 inputs and 1 output and, as shown in FIG. 14, is formed to have an optical waveguide structure (channel optical waveguide structure) in which a plurality of (in this case, the number is 8) input channel optical waveguide portions (first channel waveguide portions) 22, an optical coupler portion 23, and one output channel optical waveguide portion (second channel optical waveguide portion) 29 connected to the plurality of input channel optical waveguide portions 22 via the optical coupler portion 23 are integrally provided on the same substrate 25 (in this case, an InP substrate is used). In addition, this SOA gate array integrated device has a buried structure in which the optical waveguide structure which guides a signal light is buried by semi-insulating semiconductor burying layers 26 (in this case, InP layers are used).

In this embodiment, the optical coupler portion 23 is a portion functioning to optically coupling signal lights transmitting through the plurality of (in this case, the number is 8) input channel optical waveguide portions 22 to one output channel optical waveguide portion 24 and is formed, for example, of an 8-input and 1-output mode conversion type coupler (8×1-channel flattened field coupler (FFC)).

Figure 15A:
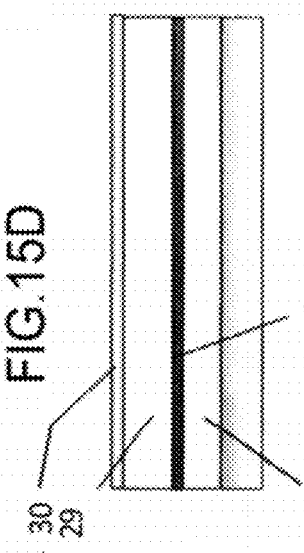
FIGS. 15A to 15C are schematic cross-sectional views each showing the structures of each channel optical waveguide portion and an optical coupler portion of the semiconductor optical integrated device (8-input and 1-output SOA gate array integrated device) according to the second embodiment and each also illustrating a method for manufacturing the above structures.

In addition, as shown in FIG. 15A, the optical waveguide structure including the input channel optical waveguide portions 22, the optical coupler portion 23, and the output channel optical waveguide portion 24 is formed such that an n-InP clad layer 27, an i-GaInAsP optical waveguide core layer 28, and a p-InP clad layer 29 (waveguide portion side) are laminated in that order on the n-InP substrate 25. In this case, for the i-GaInAsP optical waveguide core layer 28, a GaInAsP-based semiconductor material (such as a GaInAsP-semiconductor material having a bandgap wavelength of 1.3 µm with respect to a signal light of 1.55 µm) having a wider bandgap so as not to absorb a signal light is used.

In addition, in this embodiment, as shown in FIG. 14, the input channel optical waveguide portions 22 (in this case, the number is 8) each include the SOA portion 20A having an electrode on the surface thereof, and the SOA gate array 20 (a plurality of the SOAs 20A disposed in parallel, optical switch element, 8-channel SOA array) is formed of a plurality of the SOA portions 20A (switching SOA portions) (in this case, the number is 8).

In addition, the output channel optical waveguide portion 24 has a semiconductor optical amplifier (SOA) portion 21 (SOA portion for amplification, 1-channel SOA) for amplifying a signal light (output signal light) to be output. This 1-channel SOA 21 is disposed to compensate for an optical loss (in the case of 1×8-channel, it is 9 dB or more in theory) generated in the optical coupler 23, and by always supplying current, the optical amplification function can be realized by the whole element. In addition, although the SOA portion 21 is provided in the output channel optical waveguide portion 24, this SOA portion 21 may not be provided.

Figure 15D:
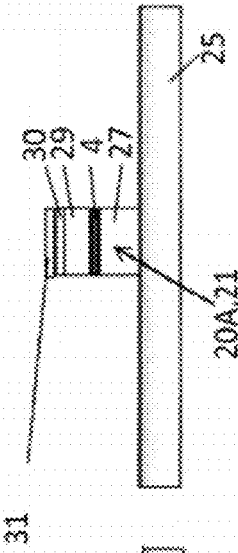
FIGS. 15D to 15F are schematic cross-sectional views each showing the structure of an SOA portion of the semiconductor optical integrated device according to the second embodiment and each also illustrating a method for manufacturing the above structure.

The optical waveguide structures of the SOA portion 20A and 21 are each formed such that the n-InP clad layer 27, the active layer 4 having the strained MQW structure of the above first embodiment or the modified example thereof, and a p-InP clad layer 29 (SOA portion side) are laminated in that order on the n-InP substrate 25 (see FIG. 15D).

Figure 15B:
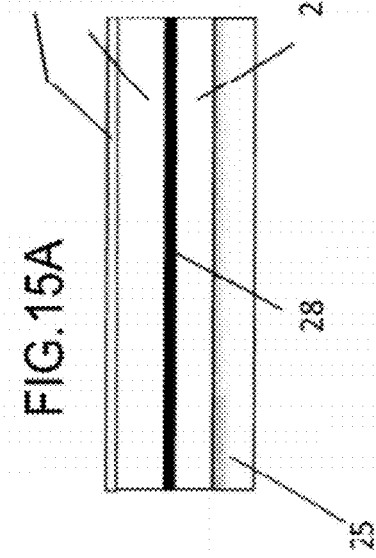
Figure 15E:
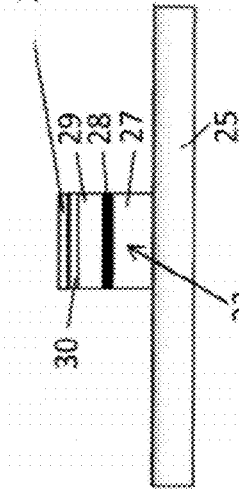
Figure 15C:
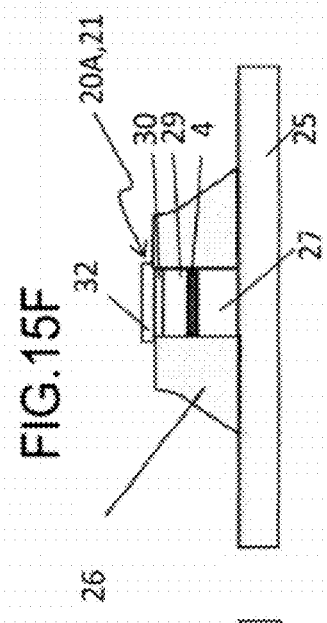
Figure 15F:
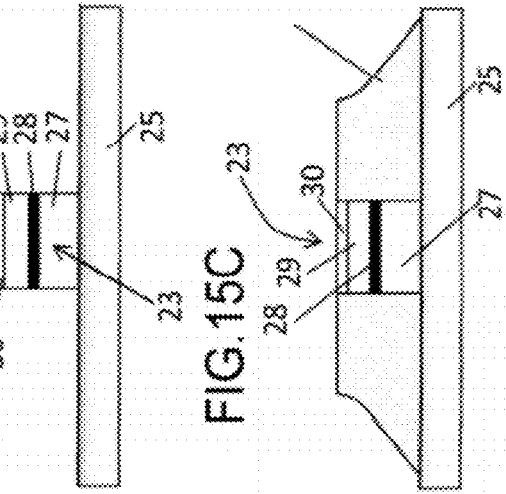

In addition, as shown in FIGS. 15C and 15F, the semi-insulating semiconductor burying layers 26 (in this case, semi-insulating InP burying layers, high resistance semiconductor burying layers, are used) each composed of a semi-insulating semiconductor material (high resistance semiconductor material) are grown, for example, by a metal organic chemical vapor deposition method (hereinafter referred to as "MOCVD method") to bury the periphery (two sides) of the optical waveguide structure (mesa structure), so that a semi-insulating semiconductor buried heterostructure (high resistance semiconductor buried heterostructure) is formed. That is, this optical integrated device includes a high resistance buried heterostructure type semiconductor optical coupler.

Hereinafter, a method for manufacturing the semiconductor integrated device (SOA gate array integrated device) of this embodiment will be described with reference to FIGS. 15A to 15F.

First, as shown in FIG. 15D, the n-InP clad layer 27 (thickness: 200 nm), and whenever necessary, an i-GaInAsP-SCH layer (composition wavelength: 1.3 μm, thickness: 100 nm) are grown (epitaxial grown) in that order on the InP substrate 25 (n-InP substrate) having n-type conductance, for example, by an MOVPE method.

Subsequently, as shown in FIG. 15D, the tensile strained i-$Ga_{0.58}In_{0.42}As$ barrier layers 4B (tensile strain: 0.80%, thickness: 5 nm) and the tensile strained i-$Ga_{0.48}In_{0.52}As$ well layers 4A (tensile strain: 0.10%, thickness: 5 nm) are alternately grown 6 times, so that the strained MQW active layer 4 is formed.

An i-GaInAsP-SCH layer (composition wavelength: 1.3 μm, thickness: 100 nm) is grown on this active layer 4 whenever necessary, and as shown in FIG. 15D, the p-InP clad layer 29 (SOA portion side, thickness: 200 nm) is formed.

Next, $SiO_2$ masks are formed only above areas in which the SOA portions 20A and 21 are to be formed, and a laminate structure from the p-InP clad layer 29 (SOA portion side) to the active layer 4 formed in the remaining area (area in which the input channel optical waveguide portions 22, the output channel optical waveguide portion 24, and the optical coupler portion 23 are formed) is removed, and in order to form the optical waveguide structure in the area obtained by this removing in which the optical coupler portion 23, the input channel optical waveguide portions 22, and the output channel optical waveguide portion 24 are formed, as shown in FIG. 15A, the i-GaInAsP optical waveguide core layer 28 (thickness: 200 nm, composition wavelength: 1.3 μm) and the p-InP clad layer 29 (waveguide portion side, thickness: approximately 300 nm) are butt-joint grown in that order from the bottom.

Next, after the $SiO_2$ masks are removed, as shown in FIGS. 15A and 15D, a p-InP clad layer 29 (entire region, thickness: approximately 2 μm), and a p-GaInAs contact layer 30 (thickness: 500 nm, composition wavelength: 1.3 μm) are grown in that order on the entire wafer surface, for example, by an MOVPE method. Accordingly, as shown in FIG. 15A, a laminate structure forming the optical coupler portion 23, the input channel optical waveguide portions 22, and the output channel optical waveguide portion 24 is formed, and as shown in FIG. 15D, a laminate structure forming the SOA portions 20A and 21 is also formed.

Next, the optical waveguide structure is formed, for example, by dry etching.

First, a $SiO_2$ mask 31 is formed having a master pattern for forming the optical waveguide structure which includes the SOA portions 20A and 21, the optical coupler portion 23, the input channel optical waveguide portions 22, and the output channel optical waveguide portion 24.

Subsequently, as shown in FIGS. 15B and 15E, dry etching is performed, for example, by an inductively coupled plasma reactive ion etching (ICP-RIE) method using this $SiO_2$ mask 31, a waveguide mesa structure (optical waveguide structure forming the SOA portions 20A and 21 (SOA waveguide portions), the optical coupler portion 23 (optical coupler waveguide portion), the input channel optical waveguide portions 22, and the output channel optical waveguide portion 24) having a height, for example, of 3 μm is formed.

Next, as shown in FIGS. 15C and 15F, the semi-insulating burying layers 26 (semi-insulating (SI) InP block layers, high resistance InP burying layers) doped, for example, by Fe are grown, for example, by an MOVPE method, so that the periphery of the waveguide mesa structure is uniformly and flatly buried by the semi-insulating InP burying layers 26, thereby forming the semi-insulating buried heterostructure.

Subsequently, as shown in FIG. 15F, electrodes (SOA electrodes) 32 having the structure similar to that used, for example, in a general semiconductor laser are formed above regions in which the SOA portions 20A and 21 are formed (that is, over the SOA active layers).

Furthermore, after anti-reflection (AR) coating for preventing reflection of signal light is performed on end surfaces at the input and the output sides of the device, chips (devices) are obtained by cleavage cutting, so that the SOA gate array integrated device as the optical integrated device is completed.

As described above, the semiconductor optical amplifiers (SOA portions), the optical function element (optical coupler portion), and the optical waveguides (optical waveguide portions) are formed on the same substrate, so that the SOA gate array integrated device as the semiconductor optical integrated device is formed.

Hence, according to the semiconductor optical integrated device of this embodiment, since the semiconductor optical amplifiers of the above first embodiment and/or the modified example thereof are provided, as in the case of the above first embodiment and the modified example thereof, over a wide wavelength band, polarization independent optical amplification characteristics can be obtained, and a flat gain spectrum can also be advantageously obtained.

In addition, the semiconductor integrated device of this embodiment integrally includes the semiconductor optical amplifiers of the above first embodiment and/or the modified example thereof, the optical coupler, and the optical waveguide portions; however, the semiconductor integrated device of this embodiment is not limited thereto, and a semiconductor optical integrated device may be formed by integrating another optical functional element, such as a laser light source, an optical modulator, a phase modulator, or an optical filter, the semiconductor optical amplifiers of the above first embodiment and/or the modified example thereof, and optical waveguides.

In addition, the present invention is not limited to the structures of the above-described embodiments and modified examples thereof and may be variously changed and modified without departing from the spirit and scope of the present invention.

For example, although the substrate having n-type conductance is used in the above first embodiment and the modified example thereof, the substrate is not limited thereto, and the device may be formed, for example, using a substrate having p-type conductance or a semi-insulating substrate.

All examples and conditional language recited herein are intended for pedagogical purposes to aid the reader in understanding the invention and the concept contributed by the inventor to furthering the art, and are to be construed as being without limitation to such specifically recited examples and conditions, nor does the organization of such examples in the specification related to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A semiconductor optical amplifier comprising:
   a multi-quantum well active layer which is formed on an InP substrate and which includes well layers and barrier layers alternately laminated to each other,
   wherein the well layers and the barrier layers have a same composition of group V atoms and a same composition ratio of group V atoms, and
   the well layers and the barrier layers have a same composition of group III atoms and the well layers have a different composition ratio of group III atoms from a composition ratio of group III atoms in the barrier layers,
   each of the well layers and each of the barrier layers each have a tensile strain, and
   the tensile strain of each of the barrier layers is larger than the tensile strain of each of the well layers.

2. The semiconductor optical amplifier according to claim 1,
   wherein the well layers and the barrier layers each include a semiconductor material in which, in accordance with the tensile strain, energy levels of electrons, light holes, and heavy holes are shifted to a high energy level, a low energy level, and a high energy level, respectively.

3. The semiconductor optical amplifier according to claim 1,
   wherein the well layers and the barrier layers each include $Ga_xIn_{1-x}As_yP_{1-y}$ ($0 \leq x \leq 1$, $0 \leq y \leq 1$), $Al_xGa_yIn_{1-x-y}As_y$ ($0 \leq x \leq 1$, $0 \leq y \leq 1$), or $Ga_xIn_{1-x}N_yAs_{1-y}$ ($0 \leq x \leq 1$, $0 \leq y \leq 1$).

4. The semiconductor optical amplifier according to claim 1,
   wherein the tensile strain of each of the well layers is 0.05% or more.

5. The semiconductor optical amplifier according to claim 1,
   wherein the tensile strain of each of the barrier layers is 0.05% or more.

6. The semiconductor optical amplifier according to claim 1, wherein the thicknesses of the well layers and the barrier layers are each 10 nm or less.

7. The semiconductor optical amplifier according to claim 1,
   wherein the thickness of the multi-quantum well active layer is 100 nm or less.

8. The semiconductor optical amplifier according to claim 1,
   wherein the well layers include the same semiconductor material and have the same composition, and
   the barrier layers include the same semiconductor material and have the same composition.

9. A semiconductor optical integrated device having the semiconductor optical amplifier according to claim 1, comprising:
   an optical functional element; and
   an optical waveguide;
   wherein the semiconductor optical amplifier, the optical functional element, and the optical waveguide are integrally provided on the same substrate.

10. A method for manufacturing a semiconductor optical amplifier, comprising: alternately laminating well layers each having an tensile strain and barrier layers each having an tensile strain which is larger than that of each of the well layers so as to form a multi-quantum well active layer, wherein the well layers and the barrier layers have a same composition of group V atoms and a same composition ratio of group V atoms, and
   the well layers and the barrier layers have a same composition of group III atoms and the well layers have a different composition ratio of group III atoms from a composition ratio of group III atoms in the barrier layers.

11. The method for manufacturing a semiconductor optical amplifier according to claim 10, wherein the well layers and the barrier layers each include a semiconductor material in which energy levels of electrons, light holes, and heavy holes are shifted to a high energy level, a low energy level, and a high energy level, respectively, in accordance with the tensile strain.

12. The method for manufacturing a semiconductor optical amplifier according to claim 10,
   wherein the well layers and the barrier layers each include $Ga_xIn_{1-x}As_yP_{1-y}$ ($0 \leq x \leq 1$, $0 \leq y \leq 1$), $Al_xGa_yIn_{1-x-y}As_y$ ($0 \leq x \leq 1$, $0 \leq y \leq 1$), or $Ga_xIn_{1-x}N_yAs_{1-y}$ ($0 \leq x \leq 1$, $0 \leq y \leq 1$).

13. The method for manufacturing a semiconductor optical amplifier according to claim 10,
   wherein the tensile strain in each of the well layers is 0.05% or more.

14. The method for manufacturing a semiconductor optical amplifier according to claim 10,
   wherein the barrier layers each have an tensile strain of 0.05% or more.

15. The method for manufacturing a semiconductor optical amplifier according to claim 10,
   wherein the well layers each have a thickness of 10 nm or less, and
   the barrier layers each have a thicknesses of 10 nm or less.

16. The method for manufacturing a semiconductor optical amplifier according to claim 10,
   wherein the multi-quantum well active layer has a thickness of 100 nm or less.

17. The method for manufacturing a semiconductor optical amplifier according to claim 10,
   wherein the well layers include the same semiconductor material and have the same composition, and
   the barrier layers include the same semiconductor material and have the same composition.

* * * * *